US010418076B2

(12) United States Patent
Meinerzhagen et al.

(10) Patent No.: US 10,418,076 B2
(45) Date of Patent: Sep. 17, 2019

(54) APPARATUS FOR DATA RETENTION AND SUPPLY NOISE MITIGATION USING CLAMPS

(71) Applicant: Intel Corporation, Santa Clara, CA (US)

(72) Inventors: Pascal A. Meinerzhagen, Hillsboro, OR (US); Stephen T. Kim, Hillsboro, OR (US); Anupama A. Thaploo, Maricopa, AZ (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/706,521

(22) Filed: Sep. 15, 2017

(65) Prior Publication Data

US 2018/0024761 A1 Jan. 25, 2018

Related U.S. Application Data

(63) Continuation of application No. 15/151,402, filed on May 10, 2016, now Pat. No. 9,766,827.

(51) Int. Cl.
*G11C 5/14* (2006.01)

(52) U.S. Cl.
CPC .................................... *G11C 5/148* (2013.01)

(58) Field of Classification Search
CPC ....................................................... G05F 1/613
See application file for complete search history.

(56) References Cited

U.S. PATENT DOCUMENTS 5,544,110 A 8/1996 Yuh
5,726,562 A * 3/1998 Mizuno ................. G11C 11/412 323/312
6,049,245 A * 4/2000 Son ........................ G11C 5/147 326/17
6,242,948 B1 6/2001 Makino
6,559,708 B2 * 5/2003 Notani ............... H03K 19/0016 327/534
6,570,439 B2 * 5/2003 Berthold ................ G11C 5/147 327/544
7,372,746 B2 5/2008 Kim (Continued)

OTHER PUBLICATIONS

Ex Parte Quayle action mailed Dec. 23, 2016 for U.S. Appl. No. 15/151,402.

(Continued)

*Primary Examiner* — Jeffery S Zweizig
(74) *Attorney, Agent, or Firm* — Green, Howard, & Mughal LLP

(57) ABSTRACT

An apparatus is provided which comprises: a first power gate transistor coupled to an ungated power supply node and a gated power supply node, the first power gate transistor having a gate terminal controllable by a first logic; and a second power gate coupled to the ungated power supply node and the gated power supply node, the second power gate transistor having a gate terminal controllable by a second logic, wherein the first power gate transistor is larger than the second power gate transistor, and wherein the second logic is operable to: weakly turn on the second power gate, fully turn on the second power gate, turn off the second power gate, and connecting the second power gate as diode.

22 Claims, 21 Drawing Sheets

(56) References Cited

U.S. PATENT DOCUMENTS 7,498,836 B1 * 3/2009 Tuan ...................... G11C 5/147 326/38
7,671,663 B2 * 3/2010 Houston ................. G05F 3/205 327/534
7,705,625 B2 * 4/2010 Yoo ..................... G11C 11/4074 326/26
7,863,971 B1 * 1/2011 Nayak ................... G06F 1/3203 327/546
8,456,140 B2 6/2013 Patil et al.
8,519,775 B2 * 8/2013 Idgunji .............. H03K 19/0016 327/534
9,966,940 B2 * 5/2018 Rotem ................. H03K 17/687
2007/0030057 A1 2/2007 Wang et al.
2009/0237107 A1 9/2009 Lee et al.
2009/0300569 A1 12/2009 Frenkil et al.
2013/0135955 A1 5/2013 McCombs et al.
2013/0293282 A1 11/2013 Rotem et al.
2016/0041945 A1 2/2016 Mishaeli et al.

OTHER PUBLICATIONS

International Search Report & Written Opinion dated Jul. 13, 2017 for U.S. Patent Application No. PCT/US17/26208.

Notice of Allowance dated Jun. 2, 2017 for U.S. Appl. No. 15/151,402.

Hua, Chung-Hsien et al., "Distributed Data-Retention Power Gating Techniques for Column and Row Co-Controlled embedded SRAM", Proceedings of the 2005 IEEE International Workshop on Memory Technology, Design, and Testing (MTDT'05) 1087-4852, 6 pages.

Kim, Suhwan et al., "Experimental Measurement of a Novel Power Gating Structure with Intermediate Power Saving Mode", Proceedings of the 2004 International Symposium on Low Power Electronics and Design (ISLPED'04), pp. 20-25 (6 pages).

International Preliminary Report on Patentability from PCT/US2017/026208 dated Nov. 22, 2018, 9 pgs.

* cited by examiner

SAMPLE COMMAND FORMAT 900

SAMPLE COMMAND SEQUENCE 910

Virtual VCC, PMOS 2-stack

Virtual VCC, NMOS 2-stack

Virtual VCC, NMOS 2-stack

Virtual VCC, PMOS 2-stack

Virtual VCC, PMOS n-stack

APPARATUS FOR DATA RETENTION AND SUPPLY NOISE MITIGATION USING CLAMPS

CLAIM OF PRIORITY

This Application is a Continuation of, and claims priority to, U.S. application Ser. No. 15/151,402, filed on 10 May 2016, to be issued as U.S. Pat. No. 9,766,827 on 19 Sep. 2017, and titled "Apparatus For Data Retention And Supply Noise Mitigation Using Clamps", which is incorporated by reference in its entirety for all purposes.

BACKGROUND

As efficient power management for handheld devices (e.g., smart phones) becomes crucial, entering and/or exiting power-down mode(s) become quite frequent. Today many processors use fine-grain power gating to reduce the leakage power of inactive circuit blocks by means of power gates (PGs). These PGs cause blocks of circuits to enter various power modes including destructive sleep. The term "destructive sleep" conventionally refers to a sleep mode where data in memory is lost because power supply level is dropped close to zero. To return to normal mode, data in the memory and other sequential logics (such as flip-flops and latches) may have to be restored from a secondary memory source, and this process lowers the overall performance of the computing system. For a constant power budget, the leakage savings (from destructive sleep) can be traded off for a performance gain. Unfortunately, conventional destructive sleep results in memory and flip-flop data loss, whereas data needs to be retained in a variety of sleep states. Further, fast wake-up of a gated power domain can lead to supply noise in neighboring circuits.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
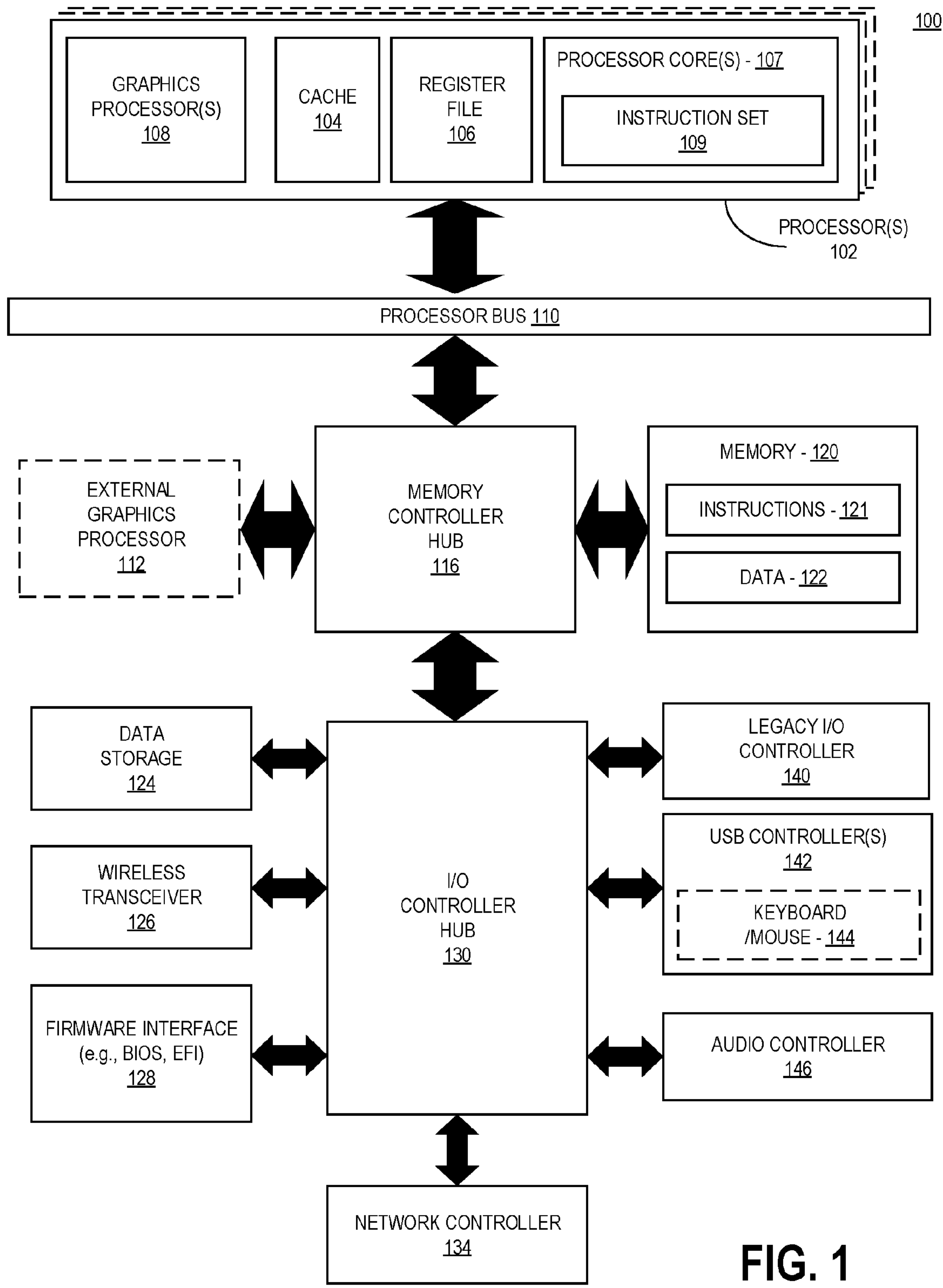
FIG. 1 illustrates a block diagram of a data processing system with apparatus for data retention and supply noise mitigation, according to some embodiments of the disclosure.

Existing solutions for data retention during sleep mode can be classified into micro-architecture and circuit centric approaches. Micro-architectural solutions include reading out the state of flip-flops and memories into an external storage device (e.g., a non-volatile memory) prior to initiating a sleep mode, and restoring the states of the flip-flops and memories by writing data back after wake-up from the sleep mode. This approach uses hardware for scanning data in and out from an external data storage. This approach also impacts the system performance due to the significant latency associated with saving and restoring data.

Circuit centric approaches include retention flip-flops and an individual supply voltage for the memories (or for their bit-cells). Retention flip-flops entail a significant area overhead compared to their non-retention counterpart, even if shadow latches are avoided by converting the slave latch to an always-on circuit. In order to ensure data retention in memories (such as Static Random Access Memories), an always-on supply grid for the bit-cells is required. This may be an expensive overhead because non-retention circuit blocks may be power-gated while retention circuits remain on (i.e., area-costly isolation cells may be needed for this approach).

In some embodiments, to reduce sharp di/dt current peaks (e.g., derivative of current with reference to time) and associated voltage droops on shared supply rails during wake-up of a gated circuit, the wake-up process is slowed down. For example, primary power gates are first gradually turned on using a digital-to-analog (DAC) before triggering a single long daisy chain of secondary power gates. Often, different logic blocks in a shared voltage domain are not allowed to wake up simultaneously to avoid high rush current and supply noise. All these solutions lead to long wake-up latencies and can potentially impact the system performance.

As opposed to these micro-architectural and circuit centric approaches for data retention, some embodiments provide a single retention voltage to all retention and non-retention circuits. In some embodiments, an apparatus is provided which comprises a first power gate transistor coupled to an ungated power supply node and a gated power supply node, and where the first power gate transistor has a gate terminal controllable by a first logic. The first power gate transistor is the main power gate (or primary power gate). In some embodiments, the apparatus further comprises: a second power gate coupled to the ungated power supply node and the gated power supply node, and where the second power gate transistor has a gate terminal controllable by a second logic. The second power gate transistor(s) are the secondary power gates, and where the first power gate transistor is substantially larger in size (W) than the second power gate transistor (e.g., the first power gate transistor is 10 times larger in area than the second power gate). In some embodiments, the second logic is operable to: weakly turn on the second power gate, fully turn on the second power gate, and turn off the second power gate.

The scheme of the various embodiments entails little to no system performance impact beyond the wake-up latency found in conventional power-gated circuits, since there is no need for saving and re-storing data. Further, the area overhead is negligible since existing power gates are re-used to enable several retentive sleep modes. Additionally, in some embodiments, all circuits share a single supply rail, which can be kept at a retention voltage (e.g., for retentive sleep), decay to ground (e.g., for destructive sleep), or pulled up to a power supply level (e.g., for active operation). Other technical effects will be evident from the description of the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a block diagram of a data processing system 100 with apparatus for data retention and supply noise mitigation, according to some embodiments of the disclosure. Data processing system 100 includes one or more processors 102 and one or more graphics processors 108, and may be a single processor desktop system, a multiprocessor workstation system, or a server system having a large number of processors 102 or processor cores 107. In some embodiments, data processing system 100 is a system on a chip integrated circuit (SOC) for use in mobile, handheld, or embedded devices.

An embodiment of data processing system 100 can include, or be incorporated within a server-based gaming platform, a game console, including a game and media console, a mobile gaming console, a handheld game console, or an online game console. In some embodiments, data processing system is a mobile phone, smart phone, tablet computing device or mobile Internet device. Data processing system 100 can also include, couple with, or be integrated within a wearable device, such as a smart watch wearable device, smart eyewear device, augmented reality device, or virtual reality device. In some embodiments, data processing system 100 is a television or set top box device having one or more processors 102 and a graphical interface generated by one or more graphics processors 108.

In some embodiments, one or more processors 102 each include one or more processor cores 107 to process instructions which, when executed, perform operations for system and user software. In some embodiments, each of the one or more processor cores 107 is configured to process a specific instruction set 109. The instruction set 109 may facilitate Complex Instruction Set Computing (CISC), Reduced Instruction Set Computing (RISC), or computing via a Very Long Instruction Word (VLIW). Multiple processor cores 107 may each process a different instruction set 109 which may include instructions to facilitate the emulation of other instruction sets. Processor core 107 may also include other processing devices, such a Digital Signal Processor (DSP).

In some embodiments, processor 102 includes cache memory 104. Depending on the architecture, processor 102 can have a single internal cache or multiple levels of internal cache. In some embodiments, the cache memory is shared among various components of processor 102. In some embodiments, processor 102 also uses an external cache (e.g., a Level-3 (L3) cache or Last Level Cache (LLC)) (not shown) which may be shared among processor cores 107 using known cache coherency techniques. A register file 106 is additionally included in processor 102 which may include different types of registers for storing different types of data (e.g., integer registers, floating point registers, status registers, and an instruction pointer register). Some registers may be general-purpose registers, while other registers may be specific to the design of processor 102.

In some embodiments, processor 102 is coupled to processor bus 110 to transmit data signals between processor 102 and other components in system 100. System 100 uses an exemplary 'hub' system architecture, including a memory controller hub 116 and an input output (I/O) controller hub 130. Memory controller hub 116 facilitates communication between a memory device and other components of the system 100, while I/O Controller Hub (ICH) 130 provides connections to I/O devices via a local I/O bus.

In some embodiments, memory device 120, can be a Dynamic Random Access Memory (DRAM) device, a Static Random Access Memory (SRAM) device, flash memory device, or some other memory device having suitable performance to serve as process memory. Memory 120 can store data 122 and instructions 121 for use when processor 102 executes a process. Memory controller hub 116 also couples with an optional external graphics processor 112, which may communicate with one or more graphics processors 108 in processors 102 to perform graphics and media operations.

The ICH 130 enables peripherals to connect to the memory 120 and processor 102 via a high-speed I/O bus. The I/O peripherals include an audio controller 146, a firmware interface 128, a wireless transceiver 126 (e.g., Wi-Fi, Bluetooth), a data storage device 124 (e.g., hard disk drive, flash memory, etc.), and a legacy I/O controller 140 for coupling legacy (e.g., Personal System 2 (PS/2)) devices to the system. One or more Universal Serial Bus (USB) controllers 142 connect input devices, such as keyboard and mouse 144 combinations. A network controller 134 may also couple to ICH 130. In some embodiments, a high-performance network controller (not shown) couples to processor bus 110.

Figure 2:
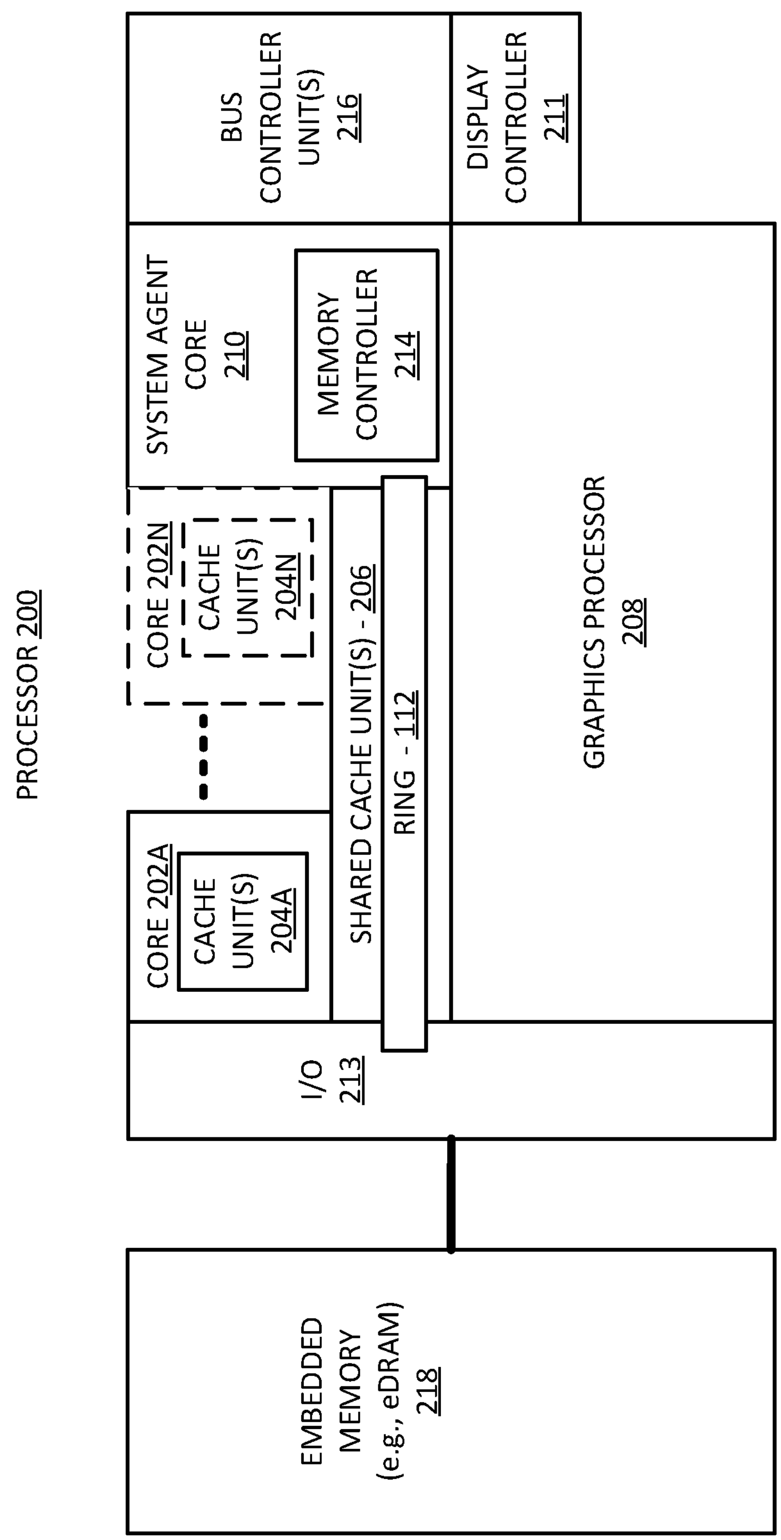
FIG. 2 illustrates a block diagram of a processor having one or more processor cores, an integrated memory controller, and an integrated graphics processor, and with apparatus for data retention and supply noise mitigation, according to some embodiments of the disclosure.

FIG. 2 illustrates a block diagram of an embodiment of processor 200 having one or more processor cores 202A-N, integrated memory controller 214, and integrated graphics processor 208. It is pointed out that those elements of FIG. 2 having the same reference numbers (or names) as the elements of any other figure can operate or function in any manner similar to that described, but are not limited to such.

Processor 200 can include additional cores up to and including additional core 202N represented by the dashed lined boxes. Each of the cores 202A-N include one or more internal cache units 204A-N. In some embodiments, each core also has access to one or more shared cached units 206.

In some embodiments, internal cache units 204A-N and shared cache units 206 represent a cache memory hierarchy within processor 200. The cache memory hierarchy may include at least one level of instruction and data cache within each core and one or more levels of shared mid-level cache, such as a Level-2 (L2), Level-3 (L3), Level-4 (L4), or other levels of cache, where the highest level of cache before external memory is classified as the last level cache (LLC). In some embodiments, cache coherency logic maintains coherency between the various cache units 206 and 204A-N.

In some embodiments, processor 200 may also include a set of one or more bus controller units 216 and system agent 210. The one or more bus controller units manage a set of peripheral buses, such as one or more Peripheral Component Interconnect buses (e.g., PCI, PCI Express). In some embodiments, system agent 210 provides management functionality for the various processor components. In some embodiments, system agent 210 includes one or more integrated memory controllers 214 to manage access to various external memory devices (not shown).

In some embodiments, one or more of the cores 202A-N include support for simultaneous multi-threading. In such embodiments, system agent 210 includes components for coordinating and operating cores 202A-N during multi-threaded processing. In some embodiments, system agent 210 may additionally include a power control unit (PCU), which includes logic and components to regulate the power state of the cores 202A-N and graphics processor 208.

In some embodiments, processor 200 additionally includes a graphics processor 208 to execute graphics processing operations. In some embodiments, graphics processor 208 couples with the set of shared cache units 206, and system agent unit 210, including one or more integrated memory controllers 214. In some embodiments, display controller 211 is coupled with graphics processor 208 to drive graphics processor output to one or more coupled displays. In some embodiments, display controller 211 may be a separate module coupled with the graphics processor via at least one interconnect, or may be integrated within the graphics processor 208 or system agent 210.

In some embodiments, a ring based interconnect unit 212 is used to couple the internal components of processor 200, however an alternative interconnect unit may be used, such as a point to point interconnect, a switched interconnect, or other techniques, including techniques well known in the art. In some embodiments, graphics processor 208 couples with ring interconnect 212 via I/O link 213.

The example I/O link 213 represents at least one of multiple varieties of I/O interconnects, including an on package I/O interconnect which facilitates communication between various processor components and a high-performance embedded memory module 218, such as an eDRAM module. In some embodiments, each of cores 202-N and graphics processor 208 use embedded memory modules 218 as shared last level cache.

In some embodiments, cores 202A-N are homogenous cores executing the same instruction set architecture. In another embodiment, cores 202A-N are heterogeneous in terms of instruction set architecture (ISA), where one or more of cores 202A-N execute a first instruction set, while at least one of the other cores executes a subset of the first instruction set or a different instruction set.

In some embodiments, processor 200 can be a part of or implemented on one or more substrates using any of a number of process technologies, for example, Complementary metal-oxide-semiconductor (CMOS), Bipolar Junction/Complementary metal-oxide-semiconductor (BiCMOS) or N-type metal-oxide-semiconductor logic (NMOS). Additionally, processor 200 can be implemented on one or more chips or as a system on a chip (SOC) integrated circuit having the illustrated components, in addition to other components.

Figure 3:
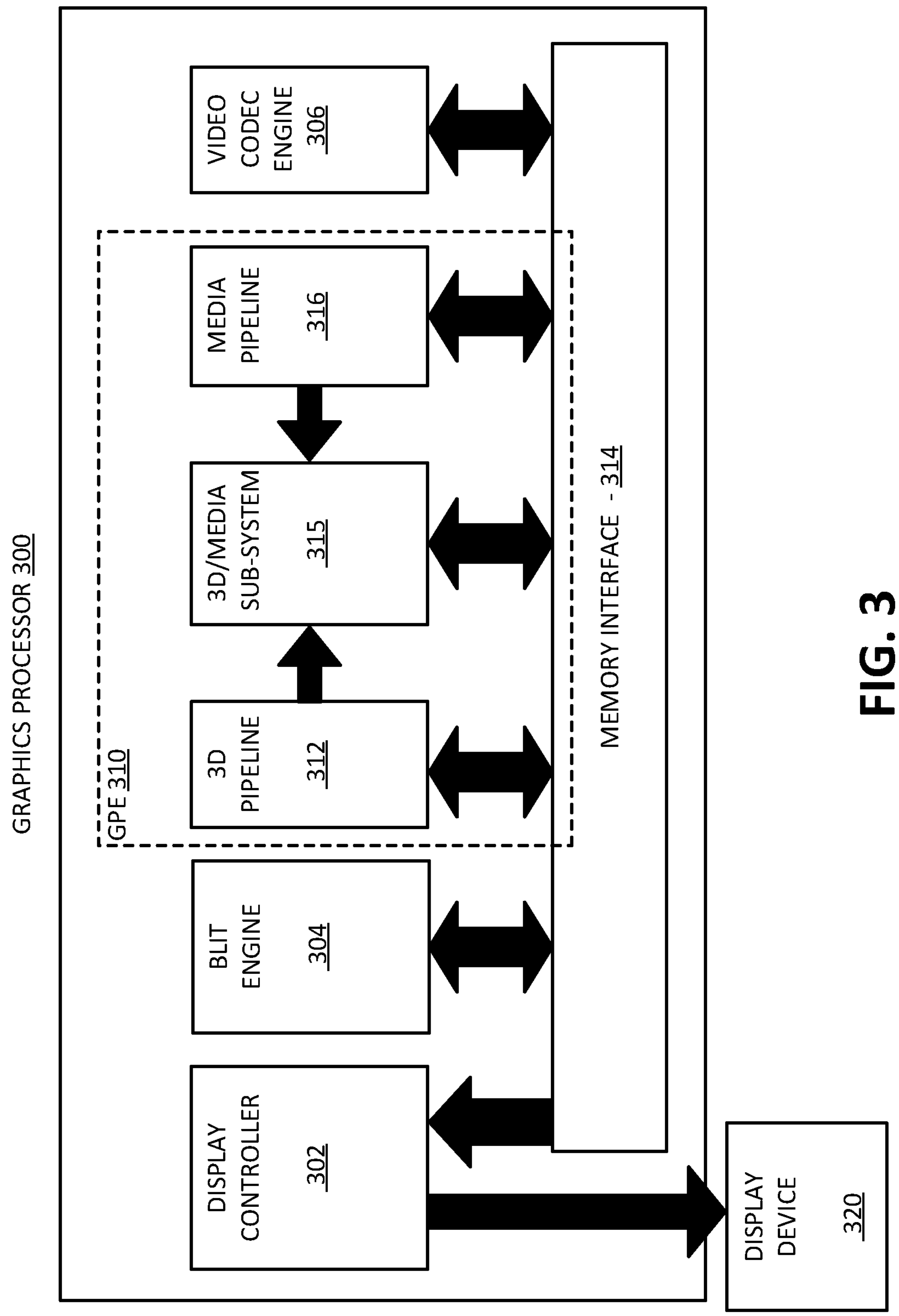
FIG. 3 illustrates a block diagram of a graphics processor which may be a discreet graphics processing unit, or may be graphics processor integrated with a plurality of processing cores, according to some embodiments of the disclosure.

FIG. 3 illustrates a block diagram of one embodiment of a graphics processor 300 which may be a discrete graphics processing unit, or may be graphics processor integrated with a plurality of processing cores. It is pointed out that those elements of FIG. 3 having the same reference numbers (or names) as the elements of any other figure can operate or function in any manner similar to that described, but are not limited to such.

In some embodiments, the graphics processor is communicated with via a memory mapped I/O interface to registers on the graphics processor and via commands placed into the processor memory. In some embodiments, graphics processor 300 includes a memory interface 314 to access memory. In some embodiments, memory interface 314 can be an interface to local memory, one or more internal caches, one or more shared external caches, and/or to system memory.

In some embodiments, graphics processor 300 also includes a display controller 302 to drive display output data to a display device 320. In some embodiments, display controller 302 includes hardware for one or more overlay planes for the display and composition of multiple layers of video or user interface elements. In some embodiments, graphics processor 300 includes video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. In some embodiments, 2D graphics operations are performed using one or more components of the graphics-processing engine (GPE) 310. In some embodiments, GPE 310 is a compute engine for performing graphics operations, including three-dimensional (3D) graphics operations and media operations, etc.

In some embodiments, GPE 310 includes a 3D pipeline 312 for performing 3D operations, such as rendering three-dimensional images and scenes using processing functions that act upon 3D primitive shapes (e.g., rectangle, triangle, etc.). In some embodiments, 3D pipeline 312 includes programmable and fixed function elements that perform various tasks within the element and/or spawn execution threads to 3D/Media sub-system 315. While 3D pipeline 312 can be used to perform media operations, an embodiment of GPE 310 also includes media pipeline 316 that is specifically used to perform media operations, such as video post processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media sub-system 315.

In some embodiments, 3D/Media subsystem 315 includes logic for executing threads spawned by 3D pipeline 312 and media pipeline 316. In some embodiments, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

Figure 4:
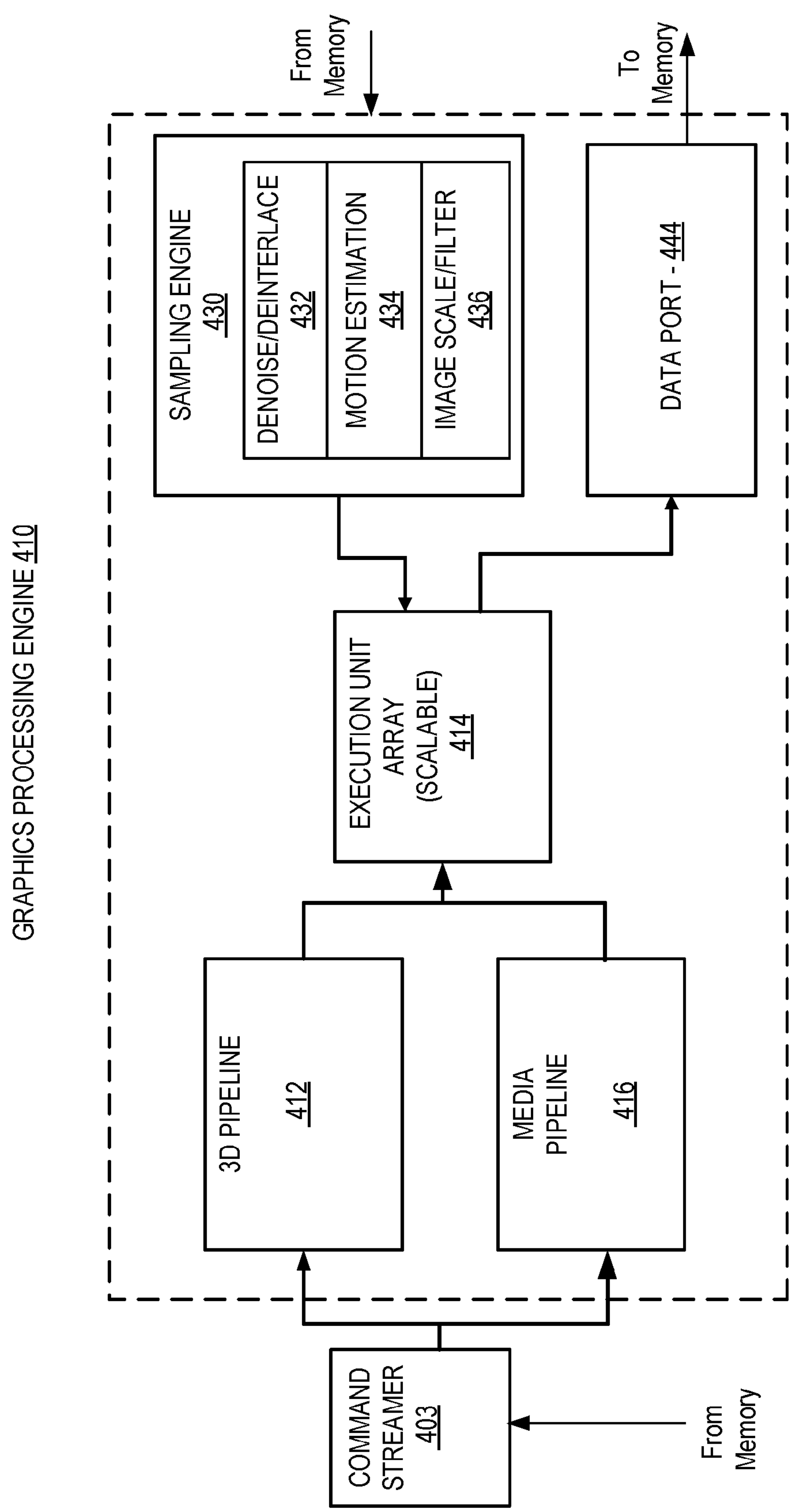
FIG. 4 illustrates a block diagram of a graphics processing engine (GPE) for a graphics processor, according to some embodiments of the disclosure.

FIG. 4 illustrates a block diagram of an embodiment of GPE 410 for a graphics processor. It is pointed out that those elements of FIG. 4 having the same reference numbers (or names) as the elements of any other figure can operate or function in any manner similar to that described, but are not limited to such.

In some embodiments, GPE 410 is a version of the GPE 310 described with reference to FIG. 3. Referring back to FIG. 4, in some embodiments, GPE 410 includes 3D pipeline 412 and media pipeline 416, each of which can be either different from or similar to the implementations of 3D pipeline 312 and media pipeline 316 of FIG. 3.

Referring back to FIG. 4, in some embodiments, GPE 410 couples with command streamer 403, which provides a command stream to the GPE 3D and media pipelines 412, 416. In some embodiments, command streamer 403 is coupled to memory, which can be system memory, or one or more of internal cache memory and shared cache memory. In some embodiments, command streamer 403 receives commands from the memory and sends the commands to 3D pipeline 412 and/or media pipeline 416. The 3D and media pipelines process the commands by performing operations via logic within the respective pipelines or by dispatching one or more execution threads to execution unit array 414. In some embodiments, execution unit array 414 is scalable, such that the array includes a variable number of execution units based on the target power and performance level of GPE 410.

In some embodiments, sampling engine 430 couples with memory (e.g., cache memory or system memory) and execution unit array 414. In some embodiments, sampling engine 430 provides a memory access mechanism for scalable execution unit array 414 that allows execution array 414 to read graphics and media data from memory. In some embodiments, sampling engine 430 includes logic to perform specialized image sampling operations for media.

In some embodiments, the specialized media sampling logic in sampling engine 430 includes de-noise/de-interlace module 432, motion estimation module 434, and image scaling and filtering module 436. In some embodiments, de-noise/de-interlace module 432 includes logic to perform one or more of de-noise or de-interlace algorithms on the decoded video data. The de-interlace logic combines alternating fields of interlaced video content into a single frame of video. The de-noise logic reduces or removes data noise from the video and image data. In some embodiments, the de-noise logic and de-interlace logic are motion adaptive and use spatial or temporal filtering based on the amount of motion detected in the video data. In some embodiments, de-noise/de-interlace module 432 includes dedicated motion detection logic (e.g., within motion estimation engine 434).

In some embodiments, motion estimation engine 434 provides hardware acceleration for video operations by performing video acceleration functions such as motion vector estimation and prediction on video data. The motion estimation engine determines motion vectors that describe the transformation of image data between successive video frames. In some embodiments, a graphics processor media codec uses the video motion estimation engine 434 to perform operations on the video at the macro-block level that may otherwise be computationally intensive to perform using a general-purpose processor. In some embodiments, motion estimation engine 434 is generally available to graphics processor components to assist with video decode and processing functions that are sensitive or adaptive to the direction or magnitude of the motion within video data.

In some embodiments, image scaling and filtering module 436 performs image-processing operations to enhance the visual quality of generated images and video. In some embodiments, scaling and filtering module 436 processes image and video data during the sampling operation before providing the data to execution unit array 414.

In some embodiments, GPE 410 includes data port 444, which provides an additional mechanism for graphics subsystems to access memory. In some embodiments, data port 444 facilitates memory access for operations including render target writes, constant buffer reads, scratch memory space reads/writes, and media surface accesses. In some embodiments, data port 444 includes cache memory space to cache accesses to memory. The cache memory can be a single data cache or separated into multiple caches for the multiple subsystems that access memory via the data port (e.g., a render buffer cache, a constant buffer cache, etc.). In some embodiments, threads executing on an execution unit in execution unit array 414 communicate with the data port by exchanging messages via a data distribution interconnect that couples each of the sub-systems of GPE 410.

Figure 5:
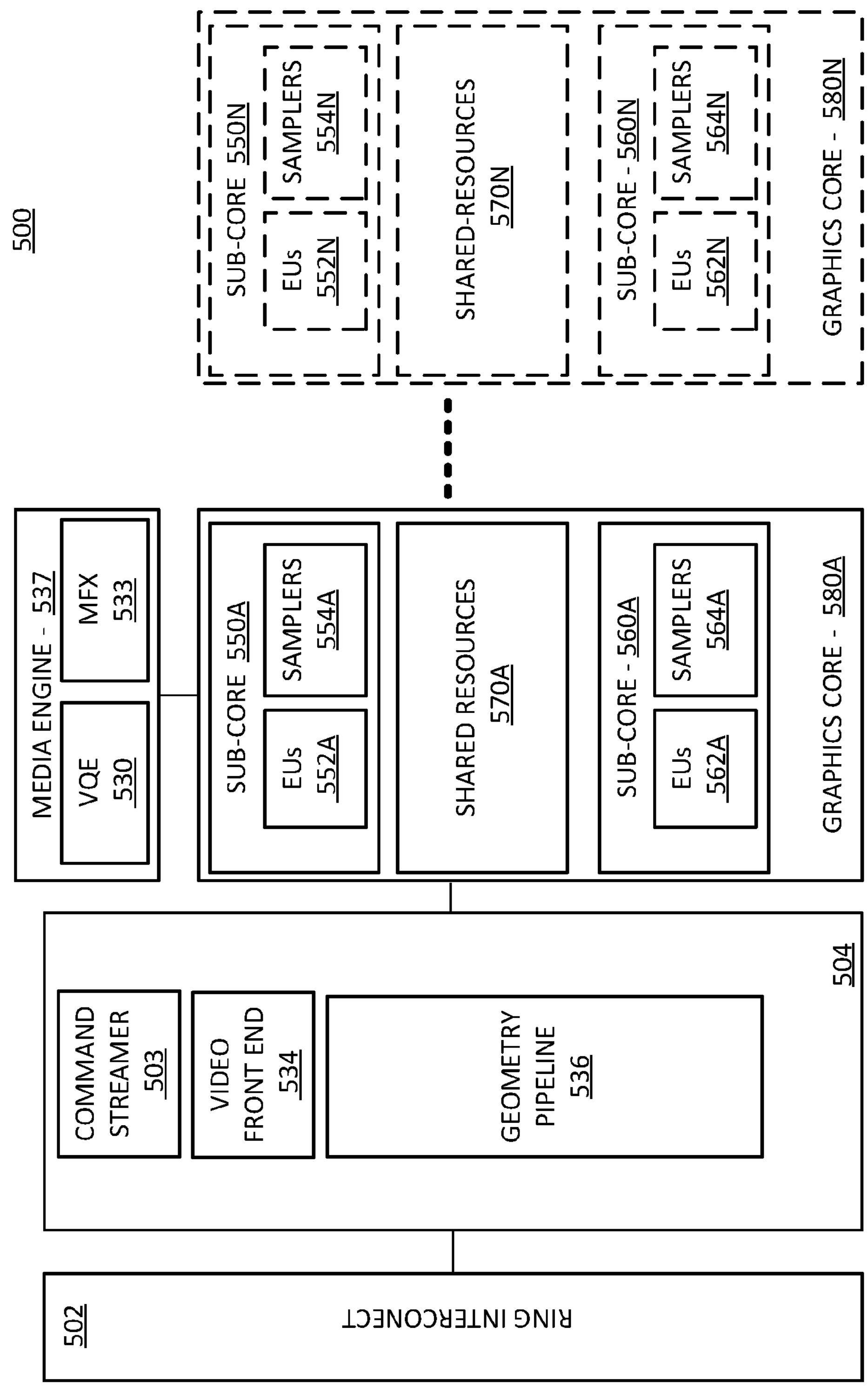
FIG. 5 illustrates a block diagram of another embodiment of a graphics processor related to an execution unit.

FIG. 5 illustrates a block diagram 500 of another embodiment of a graphics processor related to an execution unit. It is pointed out that those elements of FIG. 5 having the same reference numbers (or names) as the elements of any other figure can operate or function in any manner similar to that described, but are not limited to such.

In some embodiments, the graphics processor includes ring interconnect 502, pipeline front-end 504, media engine 537, and graphics cores 580A-N. In some embodiments, ring interconnect 502 couples the graphics processor to other processing units, including other graphics processors or one or more general-purpose processor cores. In some embodiments, the graphics processor is one of many processors integrated within a multi-core processing system.

In some embodiments, graphics processor receives batches of commands via ring interconnect 502. The incoming commands are interpreted by command streamer 503 in the pipeline front-end 504. The graphics processor includes scalable execution logic to perform 3D geometry processing and media processing via graphics core(s) 580A-N. For 3D geometry processing commands, command streamer 503 supplies the commands to geometry pipeline 536. For at least some media processing commands, command streamer 503 supplies the commands to video front end 534, which couples with a media engine 537. In some embodiments, media engine 537 includes a Video Quality Engine (VQE) 530 for video and image post processing and multi-format encode/decode (MFX) 533 engine to provide hardware-accelerated media data encode and decode. In some embodiments, geometry pipeline 536 and media engine 537 each generate execution threads for the thread execution resources provided by at least one graphics core 580A.

The graphics processor includes scalable thread execution resources featuring modular cores 580A-N (sometime referred to as core slices), each having multiple sub-cores 550A-N, 560A-N (sometimes referred to as core sub-slices). The graphics processor can have any number of graphics cores 580A through 580N. In some embodiments, the graphics processor includes graphics core 580A having at least first sub-core 550A and second core sub-core 560A. In another embodiment, the graphics processor is a low power processor with a single sub-core (e.g., 550A). In some embodiments, the graphics processor includes multiple graphics cores 580A-N, each including a set of first sub-cores 550A-N and a set of second sub-cores 560A-N. Each sub-core in the set of first sub-cores 550A-N includes at least first set of execution units 552A-N and media/texture samplers 554A-N. Each sub-core in the set of second sub-cores 560A-N includes at least a second set of execution units 562A-N and samplers 564A-N. In some embodiments, each sub-core 550A-N, 560A-N shares a set of shared resources 570A-N. In some embodiments, the shared resources include shared cache memory and pixel operation logic. Other shared resources may also be included in the various embodiments of the graphics processor.

Figure 6:
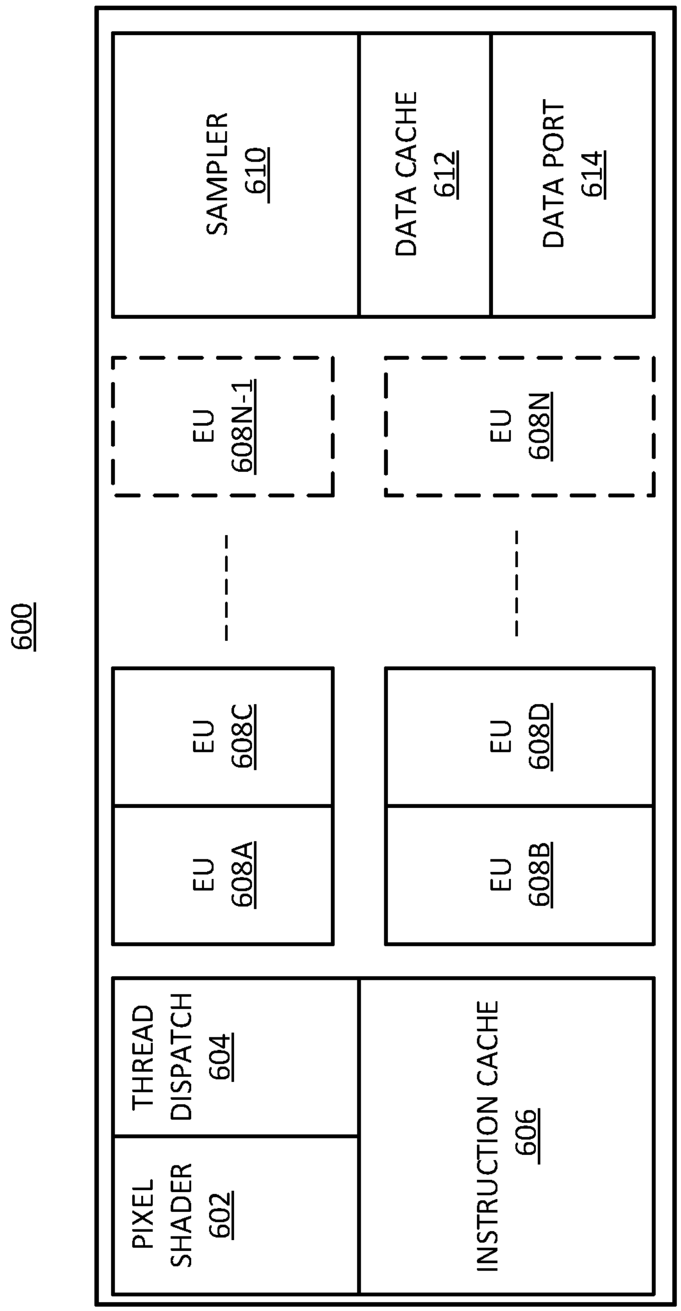
FIG. 6 illustrates thread execution logic including an array of processing elements employed in some embodiments of a GPE.

FIG. 6 illustrates thread execution logic 600 including an array of processing elements employed in one embodiment of a graphics processing engine. It is pointed out that those elements of FIG. 6 having the same reference numbers (or names) as the elements of any other figure can operate or function in any manner similar to that described, but are not limited to such.

In some embodiments, thread execution logic 600 includes pixel shader 602, thread dispatcher 604, instruction cache 606, scalable execution unit array including a plurality of execution units 608A-N, sampler 610, data cache 612, and data port 614. In some embodiments, the included components are interconnected via an interconnect fabric that links to each of the components. In some embodiments, thread execution logic 600 includes one or more connections to memory, such as system memory or cache memory, through one or more of instruction cache 606, data port 614, sampler 610, and execution unit array 608A-N. In some embodiments, each execution unit (e.g. 608A) is an individual vector processor capable of executing multiple simultaneous threads and processing multiple data elements in parallel for each thread. In some embodiments, execution unit array 608A-N includes any number of individual execution units.

In some embodiments, execution unit array 608A-N is primarily used to execute "shader" programs. In some embodiments, the execution units in array 608A-N execute an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders).

Each execution unit in execution unit array 608A-N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 608A-N support integer and floating-point data types.

The execution unit instruction set includes single instruction multiple data (SIMD) instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (quad-word (QW) size data elements), eight separate 32-bit packed data elements (double word (DW) size data elements), sixteen separate 16-bit packed data elements (word (W) size data elements), or thirty-two separate 8-bit data elements (byte (B) size data elements). However, different vector widths and register sizes are possible.

One or more internal instruction caches (e.g., 606) are included in the thread execution logic 600 to cache thread instructions for the execution units. In some embodiments, one or more data caches (e.g., 612) are included to cache thread data during thread execution. In some embodiments, sampler 610 is included to provide texture sampling for 3D operations and media sampling for media operations. In some embodiments, sampler 610 includes specialized texture or media sampling functionality to process texture or media data during the sampling process before providing the sampled data to an execution unit.

During execution, the graphics and media pipelines send thread initiation requests to thread execution logic 600 via thread spawning and dispatch logic. In some embodiments, thread execution logic 600 includes local thread dispatcher 604 that arbitrates thread initiation requests from the graphics and media pipelines and instantiates the requested threads on one or more execution units 608A-N. For example, the geometry pipeline (e.g., 536 of FIG. 5) dispatches vertex processing, tessellation, or geometry processing threads to thread execution logic 600. Referring back to FIG. 6, in some embodiments, thread dispatcher 604 can also process runtime thread spawning requests from the executing shader programs.

Once a group of geometric objects have been processed and rasterized into pixel data, pixel shader 602 is invoked to further compute output information and cause results to be written to output surfaces (e.g., color buffers, depth buffers, stencil buffers, etc.). In some embodiments, pixel shader 602 calculates the values of the various vertex attributes that are to be interpolated across the rasterized object. In some embodiments, pixel shader 602 then executes an API-supplied pixel shader program. To execute the pixel shader program, pixel shader 602 dispatches threads to an execution unit (e.g., 608A) via the thread dispatcher 604. In some embodiments, pixel shader 602 uses texture sampling logic in sampler 610 to access texture data in texture maps stored in memory. Arithmetic operations on the texture data and the input geometry data compute pixel color data for each geometric fragment, or discards one or more pixels from further processing.

In some embodiments, data port 614 provides a memory access mechanism for thread execution logic 600 output processed data to memory for processing on a graphics processor output pipeline. In some embodiments, data port 614 includes or couples to one or more cache memories (e.g., data cache 612) to cache data for memory access via the data port.

Figure 7:
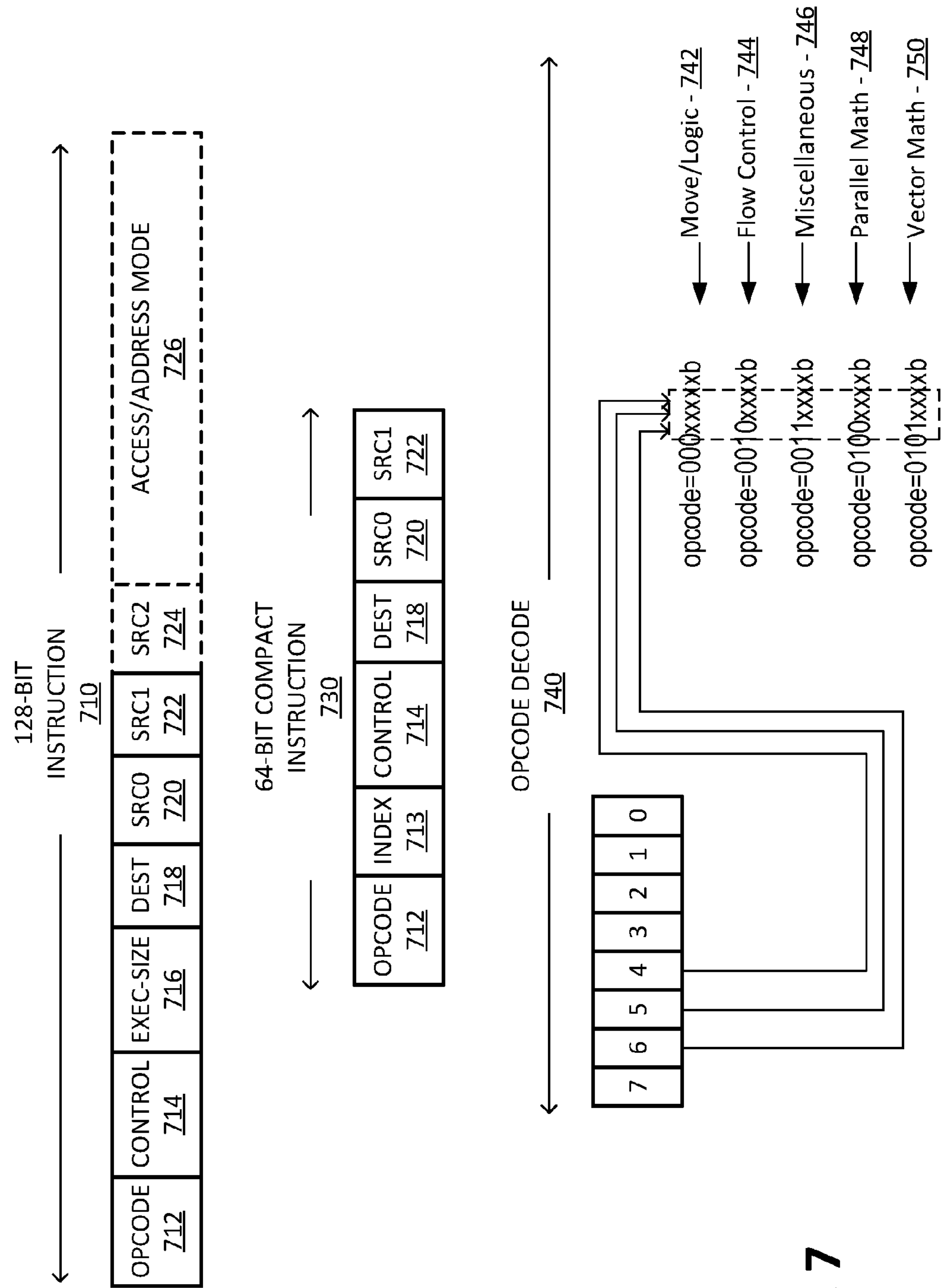
FIG. 7 illustrates a block diagram illustrating a graphics processor execution unit instruction format, according to some embodiments of the disclosure.

FIG. 7 illustrates a block diagram illustrating a graphics processor execution unit instruction format 700, according to some embodiments of the disclosure. In some embodiments, the graphics processor execution units support an instruction set having instructions in multiple formats. The solid lined boxes illustrate the components that are generally included in an execution unit instruction, while the dashed lines include components that are optional or that are only included in a sub-set of the instructions. The instruction format 700 described as illustrated are macro-instructions, in that they are instructions supplied to the execution unit, as opposed to micro-operations resulting from instruction decode once the instruction is processed.

In some embodiments, the graphics processor execution units natively support instructions in a 128-bit format 710. A 64-bit compacted instruction format 730 is available for some instructions based on the selected instruction, instruction options, and number of operands. The native 128-bit format 710 provides access to all instruction options, while some options and operations are restricted in the 64-bit format 730. The native instructions available in the 64-bit format 730 varies by embodiment. In some embodiments, the instruction is compacted in part using a set of index values in an index field 713. The execution unit hardware references a set of compaction tables based on the index values and uses the compaction table outputs to reconstruct a native instruction in the 128-bit format 710.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 714 enables control over certain execution options, such as channels selection (e.g., predication) and data channel order (e.g., swizzle). For 128-bit instructions 710 an exec-size field 716 limits the number of data channels that will be executed in parallel. In some embodiments, exec-size field 716 is not available for use in the 64-bit compact instruction format 730. Here, the access or address mode is expressed in field 726.

Some execution unit instructions have up to three operands including two source (src) operands, src0 720, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, instructions are grouped based on opcode bit-fields to simplify Opcode decode 740. For an 8-bit opcode, bits 4, 5, and 6 allow the execution unit to determine the type of opcode. The precise opcode grouping shown is just an example. In some embodiments, move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb (e.g., 0x0x) and logic instructions are in the form of 0001xxxxb (e.g., 0x01). A flow control instruction group 744 (e.g., call, jump (jmp), etc.,) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., d4) in the form of 0101xxxxb (e.g., 0x50). The vector math group performs arithmetic such as dot product calculations on vector operands.

Figure 8:
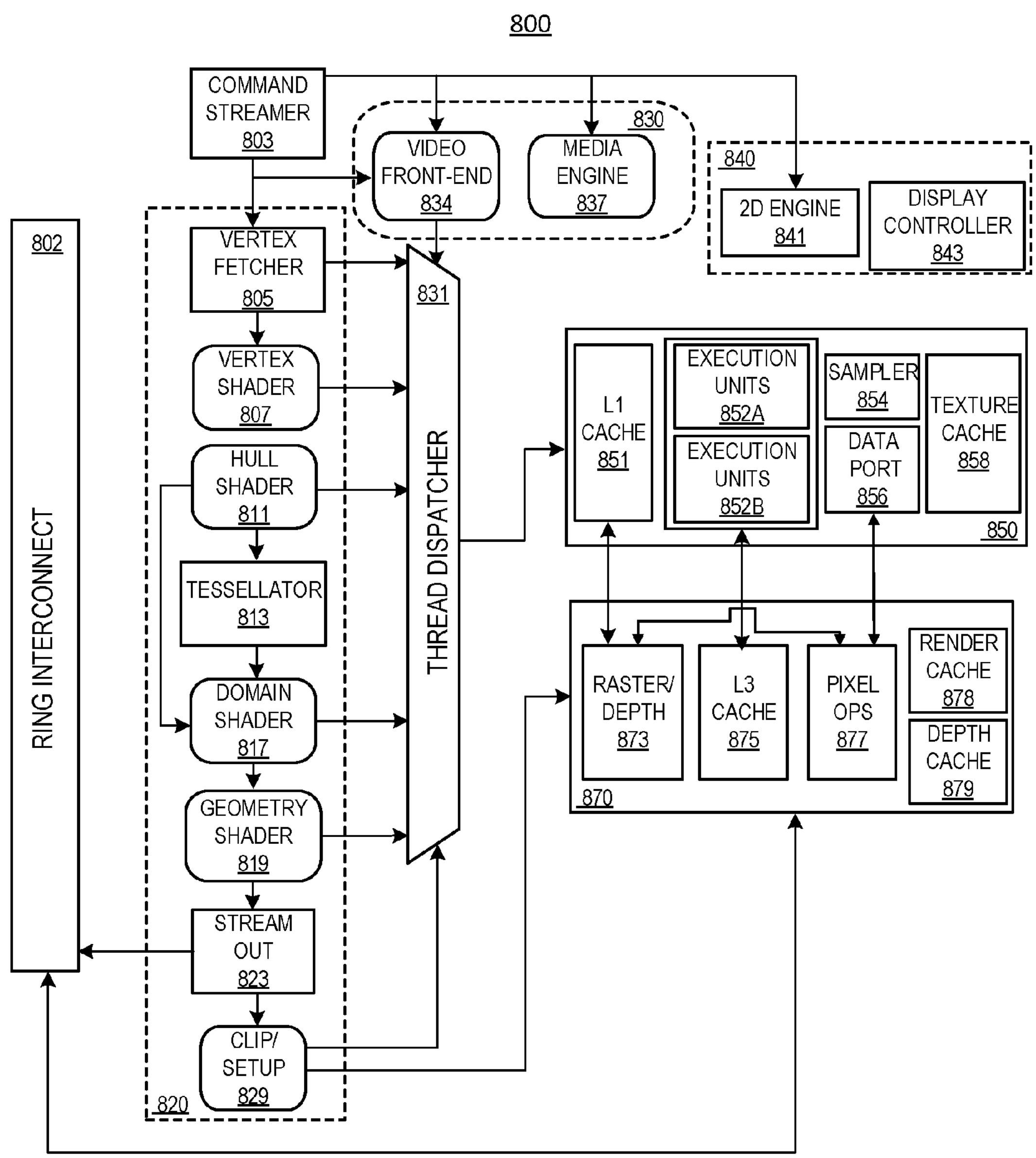
FIG. 8 is a block diagram of another embodiment of a graphics processor which includes graphics pipeline, media pipeline, display engine, thread execution logic, and render output pipeline.

FIG. 8 is a block diagram 800 of another embodiment of a graphics processor which includes graphics pipeline 820, media pipeline 830, display engine 840, thread execution logic 850, and render output pipeline 870. It is pointed out that those elements of FIG. 8 having the same reference numbers (or names) as the elements of any other figure can operate or function in any manner similar to that described, but are not limited to such.

In some embodiments, the graphics processor is a graphics processor within a multi-core processing system that includes one or more general purpose processing cores. The graphics processor is controlled by register writes to one or more control registers (not shown) or via commands issued to the graphics processor via ring interconnect 802. In some embodiments, ring interconnect 802 couples the graphics processor to other processing components, such as other graphics processors or general-purpose processors. Commands from ring interconnect 802 are interpreted by command streamer 803 which supplies instructions to individual components of graphics pipeline 820 or media pipeline 830.

In some embodiments, command streamer 803 directs the operation of a vertex fetcher 805 component that reads vertex data from memory and executes vertex-processing commands provided by command streamer 803. In some embodiments, vertex fetcher 805 provides vertex data to vertex shader 807, which performs coordinate space transformation and lighting operations to each vertex. In some embodiments, vertex fetcher 805 and vertex shader 807 execute vertex-processing instructions by dispatching execution threads to execution units 852A, 852B via thread dispatcher 831.

In some embodiments, execution units 852A, 852B are an array of vector processors having an instruction set for performing graphics and media operations. In some embodiments, execution units 852A, 852B have an attached L1 cache 851 that is specific for each array or shared between the arrays. The cache can be configured as a data cache, an instruction cache, or a single cache that is partitioned to contain data and instructions in different partitions.

In some embodiments, graphics pipeline 820 includes tessellation components to perform hardware-accelerated tessellation of 3D objects. A programmable hull shader 811 configures the tessellation operations. A programmable domain shader 817 provides back-end evaluation of tessellation output. A tessellator 813 operates at the direction of the hull shader 811 and contains special purpose logic to generate a set of detailed geometric objects based on a coarse geometric model that is provided as input to the graphics pipeline 820. In some embodiments, if tessellation is not used, the tessellation components 811, 813, and 817 can be bypassed.

In some embodiments, the complete geometric objects can be processed by geometry shader 819 via one or more threads dispatched to execution units 852A, 852B, or can proceed directly to clipper 829 (for example, by stream out block 823). In some embodiments, geometry shader 819 operates on the entire geometric objects, rather than the vertices or patches of vertices as in the previous stages of the graphics pipeline. If the tessellation is disabled, geometry shader 819 receives input from vertex shader 807. In some embodiments, geometry shader 819 is programmable by a geometry shader program to perform geometry tessellation if the tessellation units are disabled.

Prior to rasterization, vertex data is processed by clipper 829, which is either a fixed function clipper or a programmable clipper having clipping and geometry shader functions. In some embodiments, rasterizer 873 in render output pipeline 870 dispatches pixel shaders to convert the geometric objects into their per pixel representations. In some embodiments, pixel shader logic is included in thread execution logic 850.

The graphics engine has an interconnect bus, interconnect fabric, or some other interconnect mechanism that allows data and message passing amongst the major components of the graphics engine. In some embodiments, execution units 852A, 852B and associated cache(s) 851, texture and media sampler 854, and texture/sampler cache 858 interconnect via data port 856 to perform memory access and communicate with render output pipeline components of the graphics engine. In some embodiments, sampler 854, caches 851, 858, and execution units 852A, 852B each have separate memory access paths.

In some embodiments, render output pipeline 870 contains a rasterizer and depth test component 873 that converts vertex-based objects into their associated pixel-based representation. In some embodiments, the rasterizer logic includes a windower/masker unit to perform fixed function triangle and line rasterization. An associated render and depth buffer caches 878, 879 are also available in one embodiment. In some embodiments, pixel operations component 877 performs pixel-based operations on the data, though in some instances, pixel operations associated with 2D operations (e.g. bit block image transfers with blending) are performed by 2D engine 841, or substituted at display time by display controller 843 using overlay display planes. In some embodiments, a shared L3 cache 875 is available to all graphics components, allowing the sharing of data without the use of main system memory.

In some embodiments, graphics processor media pipeline 830 includes media engine 337 and video front end 834. In some embodiments, video front end 834 receives pipeline commands from command streamer 803. In some embodiments, media pipeline 830 includes a separate command streamer. In some embodiments, video front-end 834 processes media commands before sending the command to media engine 837. In some embodiments, the media engine includes thread spawning functionality to spawn threads for dispatch to thread execution logic 850 via thread dispatcher 831.

In some embodiments, the graphics engine includes display engine 840. In some embodiments, display engine 840 is external to the graphics processor and couples with the graphics processor via ring interconnect 802, or some other interconnect bus or fabric. In some embodiments, display engine 840 includes 2D engine 841 and display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, graphics pipeline 820 and media pipeline 830 are configurable to perform operations based on multiple graphics and media programming interfaces and are not specific to any one application programming interface (API). In some embodiments, driver software for the graphics processor translates the API calls that are specific to a particular graphics or media library into commands that can be processed by the graphics processor. In various embodiments, support is provided for the Open Graphics Library (OpenGL) and Open Computing Language (OpenCL) supported by the Khronos Group, the Direct3D library from the Microsoft Corporation, or, in one embodiment, both OpenGL and D3D. Support may also be provided for the Open Source Computer Vision Library (OpenCV). A future API with a compatible 3D pipeline would also be supported if a mapping can be made from the pipeline of the future API to the pipeline of the graphics processor.

Figure 9A:
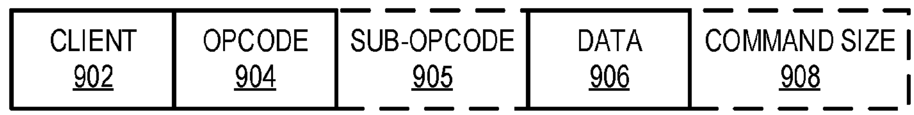
FIG. 9A illustrates a block diagram illustrating a graphics processor command format, according to some embodiments.
Figure 9B:
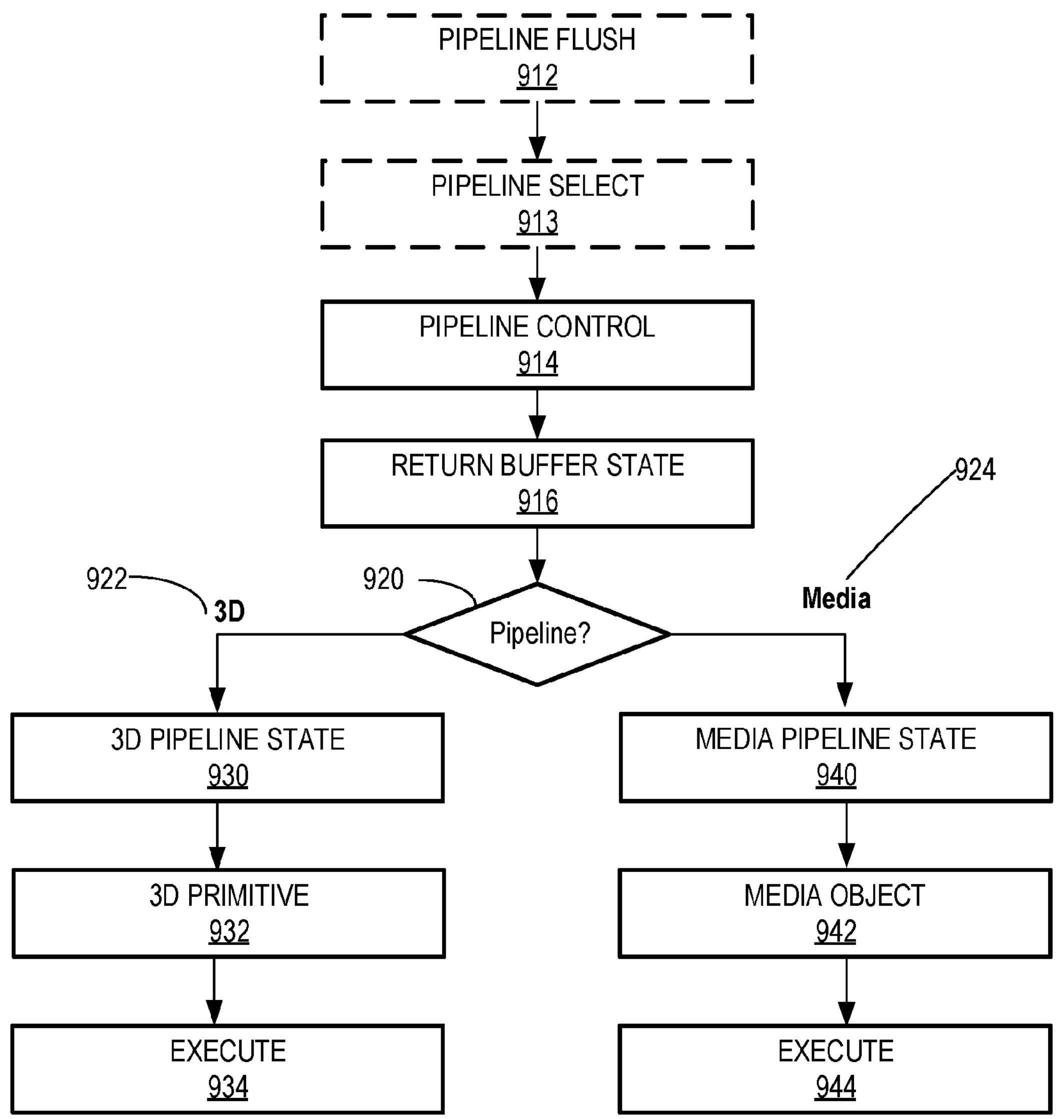
FIG. 9B illustrates a block diagram of a graphics processor command sequence, according to some embodiments of the disclosure.

FIG. 9A illustrates a block diagram illustrating a graphics processor command format 900, according to some embodiments, and FIG. 9B illustrates a block diagram of a graphics processor command sequence 910 according to some embodiments of the disclosure. It is pointed out that those elements of FIGS. 9A-B having the same reference numbers (or names) as the elements of any other figure can operate or function in any manner similar to that described, but are not limited to such.

The solid lined boxes in FIG. 9A illustrate the components that are generally included in a graphics command while the dashed lines include components that are optional or that are only included in a sub-set of the graphics commands. The example graphics processor command format 900 of FIG. 9A includes data fields to identify target client 902 of the command, command operation code (opcode) 904, and relevant data 906 for the command. In some embodiments, sub-opcode 905 and command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads opcode 904 and, if present, sub-opcode 905 to determine the operation to perform. The client unit performs the command using information in data 906 field of the command. For some commands, an explicit command size 908 is expected to specify the size of the command. In some embodiments, the command parser automatically determines the size of at least some of the commands based on the command opcode. In some embodiments, commands are aligned via multiples of a double word.

In some embodiments, flow chart in FIG. 9B shows a sample command sequence 910. Although the blocks in flowchart 910 are shown in a particular order, the order of the actions can be modified. Thus, the illustrated embodiments can be performed in a different order, and some actions/blocks may be performed in parallel. Some of the blocks and/or operations listed are optional in accordance with certain embodiments. The numbering of the blocks presented is for the sake of clarity and is not intended to prescribe an order of operations in which the various blocks must occur. Additionally, operations from the various flows may be utilized in a variety of combinations.

In some embodiments, software or firmware of a data processing system that features an embodiment of the graphics processor uses a version of the command sequence shown to set up, execute, and terminate a set of graphics operations. A sample command sequence is shown and described for illustrative purposes, however embodiments are not limited to these commands or to this command sequence. Moreover, the commands may be issued as batch of commands in a command sequence, such that the graphics processor will process the sequence of commands in an at least partially concurrent manner.

In some embodiments, sample command sequence 910 may begin with pipeline flush command 912 to cause any active graphics pipeline to complete the currently pending commands for the pipeline. In some embodiments, 3D pipeline 922 and media pipeline 924 do not operate concurrently. The pipeline flush is performed to cause the active graphics pipeline to complete any pending commands. In some embodiments, in response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, pipeline select command 913 is used when a command sequence requires the graphics processor to explicitly switch between pipelines. In some embodiments, pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, pipeline control command 914 configures a graphics pipeline for operation and is used to program 3D pipeline 922 and media pipeline 924. In some embodiments, pipeline control command 914 configures the pipeline state for the active pipeline. In some embodiments, the pipeline control command 914 is used for pipeline synchronization and to clear data from one or more cache memories within the active pipeline before processing a batch of commands.

Return buffer state commands 916 are used to configure a set of return buffers for the respective pipelines to write data. Some pipeline operations require the allocation, selection, or configuration of one or more return buffers into which the operations write intermediate data during processing. The graphics processor also uses one or more return buffers to store output data and to perform cross thread communication. In some embodiments, return buffer state 916 includes selecting the size and number of return buffers to use for a set of pipeline operations.

The remaining commands in the command sequence differ based on the active pipeline for operations. Based on pipeline determination 920, the command sequence is tailored to 3D pipeline 922 beginning with 3D pipeline state 930, or media pipeline 924 beginning at media pipeline state 940.

The commands for 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via 3D primitive 932 command are forwarded to the vertex fetch function in the graphics pipeline. The vertex fetch function uses 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via execute 934 command or event. In some embodiments, a register write triggers command execution. In some embodiments, execution is triggered via a 'go' or 'kick' command in the command sequence. In one embodiment command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, sample command sequence 910 follows media pipeline 924 path when performing media operations. In general, the specific use and manner of programming for media pipeline 924 depends on the media or compute operations to be performed. Specific media decode operations may be offloaded to the media pipeline during media decode. The media pipeline can also be bypassed and media decode can be performed in whole or in part using resources provided by one or more general purpose processing cores. In some embodiments, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as 3D pipeline 922. A set of media pipeline state commands 940 are dispatched or placed into a command queue before media object commands 942. In some embodiments, media pipeline state commands 940 include data to configure the media pipeline elements that will be used to process the media objects. This includes data to configure the video decode and video encode logic within the media pipeline, such as encode or decode format. In some embodiments, media pipeline state commands 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline state must be valid before issuing media object command 942. Once the pipeline state is configured and media object commands 942 are queued, media pipeline 924 is triggered via execute 944 command or an equivalent execute event (e.g., register write). Output from media pipeline 924 may then be post processed by operations provided by 3D pipeline 922 or media pipeline 924. In some embodiments, GPGPU operations are configured and executed in a similar manner as media operations.

Figure 10:
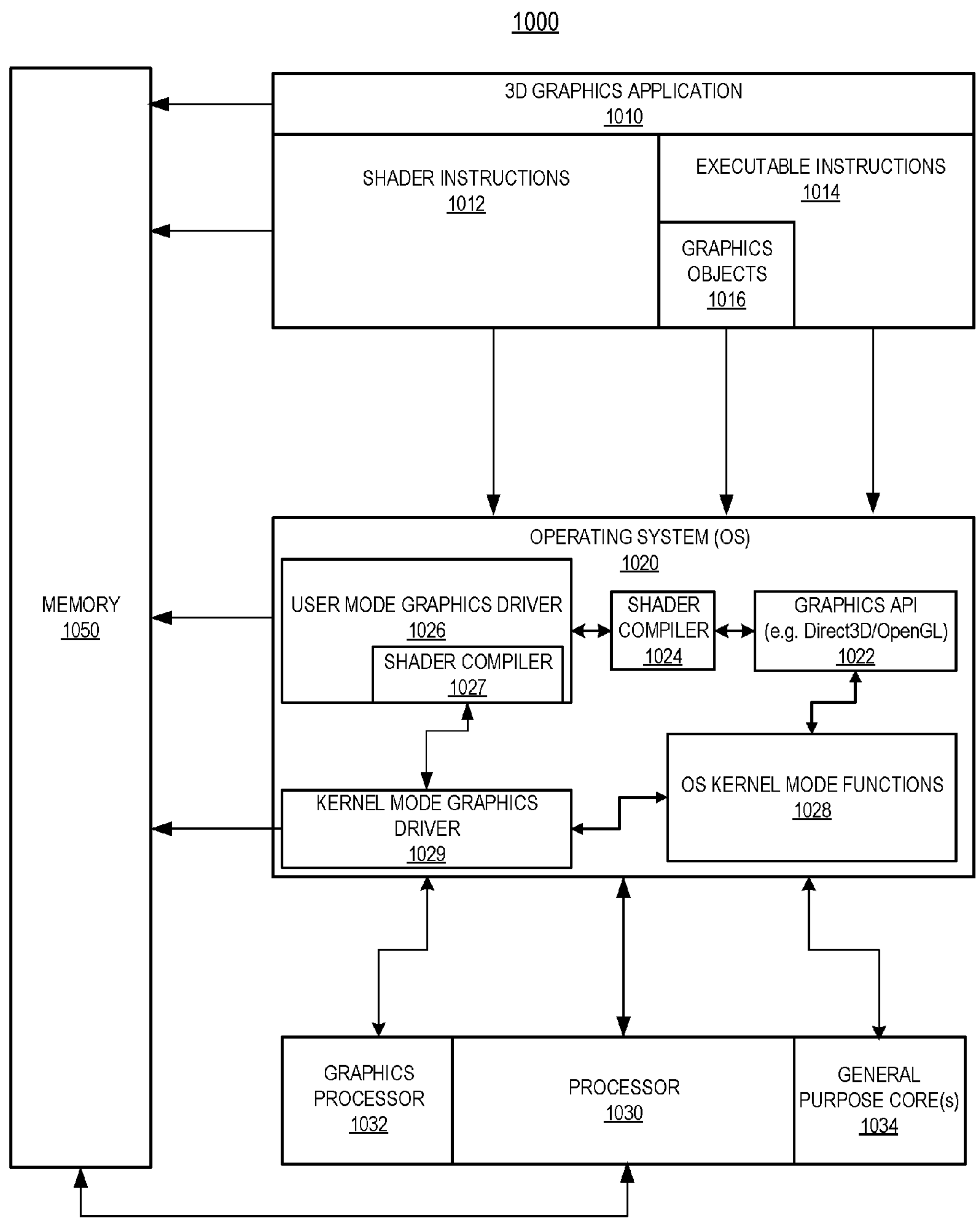
FIG. 10 illustrates a graphics software architecture for a data processing system according to some embodiments of the disclosure.

FIG. 10 illustrates a graphics software architecture 1000 for a data processing system according to some embodiments of the disclosure. It is pointed out that those elements of FIG. 10 having the same reference numbers (or names) as the elements of any other figure can operate or function in any manner similar to that described, but are not limited to such.

In some embodiments, software architecture includes 3D graphics application 1010, operating system 1020, and at least one processor 1030. In some embodiments, processor 1030 includes graphics processor 1032 and one or more general-purpose processor core(s) 1034. In some embodiments, graphics application 1010 and operating system 1020 each execute in system memory 1050 of the data processing system.

In some embodiments, 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core 1034. The application also includes graphics objects 1016 defined by vertex data.

In some embodiments, operating system 1020 may be a Microsoft® Windows® operating system from the Microsoft Corporation, a proprietary UNIX-like operating system, or an open source UNIX-like operating system using a variant of the Linux kernel. When the Direct3D API is in use, operating system 1020 uses a front-end shader compiler 1024 to compile any shader instructions 1012 in HLSL into a lower-level shader language. The compilation may be a just-in-time compilation or the application can perform share pre-compilation. In one embodiment, high-level shaders are compiled into low-level shaders during the compilation of 3D graphics application 1010.

In some embodiments, user mode graphics driver 1026 may contain a back-end shader compiler 1027 to convert shader instructions 1012 into a hardware specific representation. When the OpenGL API is in use, shader instructions 1012 in the GLSL high-level language are passed to user mode graphics driver 1026 for compilation. In some embodiments, user mode graphics driver 1026 uses operating system kernel mode functions 1028 to communicate with kernel mode graphics driver 1029. In some embodiments, kernel mode graphics driver 1029 communicates with graphics processor 1032 to dispatch commands and instructions. In some embodiments, operating system kernel mode functions 1028 is used to communicate with Graphics API (e.g., Direct3D/OpenGL) 1022.

To the extent various operations or functions are described herein, they can be described or defined as hardware circuitry, software code, instructions, configuration, and/or data. The content can be embodied in hardware logic, or as directly executable software ("object" or "executable" form), source code, high level shader code designed for execution on a graphics engine, or low level assembly language code in an instruction set for a specific processor or graphics core. The software content of the embodiments described herein can be provided via an article of manufacture with the content stored thereon, or via a method of operating a communication interface to send data via the communication interface.

A non-transitory machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

Various components described can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc. Besides what is described herein, various modifications can be made to the disclosed embodiments and implementations of the invention without departing from their scope. Therefore, the illustrations and examples herein should be construed in an illustrative, and not a restrictive sense. The scope of the disclosure should be measured solely by reference to the claims that follow.

Figure 11A:
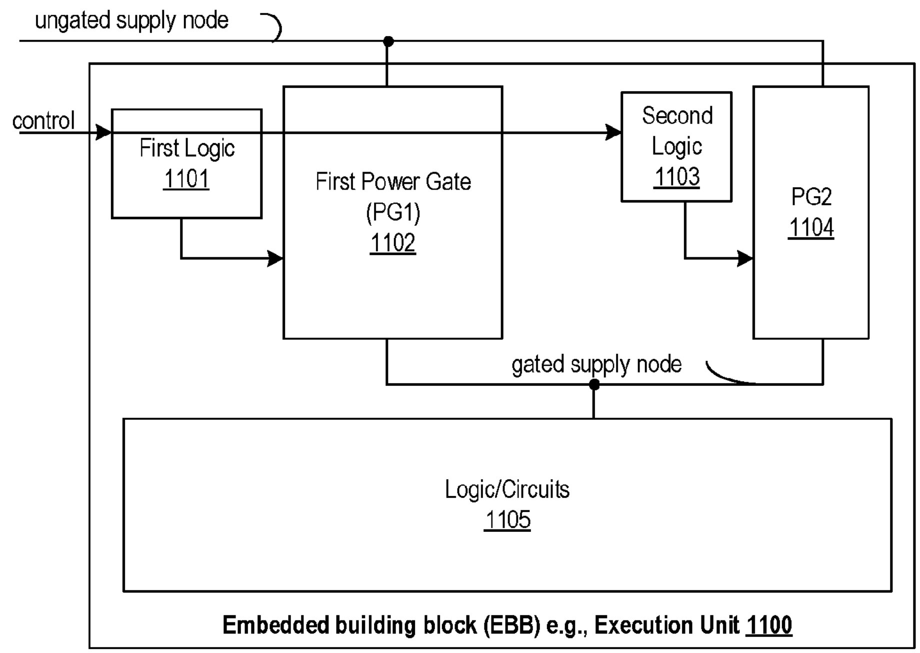
FIG. 11A illustrates an embedded building block (EBB) with lumped apparatus for data retention and supply noise mitigation, according to some embodiments of the disclosure.

FIG. 11A illustrates an embedded building block (EBB) 1100 with lumped apparatus for data retention and supply noise mitigation, according to some embodiments of the disclosure. It is pointed out that those elements of FIG. 11A having the same reference numbers (or names) as the elements of any other figure can operate or function in any manner similar to that described, but are not limited to such.

In some embodiments, EBB 1100 (e.g., execution unit 552A, or any logical block described with reference to FIGS. 1-10) comprises First Logic 1101, First Power Gate (PG1) 1102, Second Logic 1103, Second Power Gate (PG2) 1104, ungated supply node, gated supply node, and Logic/Circuits 1105. In some embodiments, PG1 (also referred to as a first power gate transistor) is coupled to the ungated power supply node and the gated power supply node. Here, the term ungated supply node generally refers to a power supply node which is directly provided with power supply via a source (e.g., a voltage regulator, a low drop-out regulator, etc.). The term gated power supply node generally refers to a power supply node which is indirectly provided with power supply via a power gate. The power gate can electrically disconnect the gated power supply node from the ungated power supply node. The power gate(s) can also change the power supply level of the gated power supply node compared to the power supply level on the ungated power supply node.

In some embodiments, PG1 1102 has a gate terminal controllable by First Logic 1101. First Logic 1101 receives control signals (e.g., sleep mode, bypass mode, 1-Vt clamp mode, 2-Vt clamp mode, n-Vt, clamp mode, where 'n' is an integer greater than two etc.). In some embodiments, First Logic 1101 receives sleep and bypass signals (which are part of control signal). In some embodiments, PG1 1102 is to remain off while PG2 1104 is in 1Vt, 2Vt, or nVt clamp mode. For example, First Logic 1101 is to be aware of that PG2 1104 is in 1Vt, 2Vt, or nVt clamp mode.

Here, PG1 1102 is the main power gate (or primary power gate). In some embodiments, PG2 1104 is coupled to the ungated power supply node and the gated power supply node. In some embodiments, PG2 1104 has a gate terminal controllable by Second Logic 1103. PG2 1104 is the secondary power gate, and PG1 1102 is substantially larger in size (e.g., area) than PG2 1104 (e.g., the first power gate transistor is 10 times larger than the second power gate), in accordance with some embodiments. In some embodiments, Second Logic 1103 is operable to: weakly turn on PG2 1104, fully turn on PG2 1104, turn off PG2 1104, enable a 1-Vt clamp on the gated power supply node, enable a 2-Vt clamp on the gated power supply node, and enable an n-Vt clamp on the gated power supply node.

In some embodiments, the 1-Vt and 2-Vt clamps can be implemented as distributed or lumped circuits. For the lumped implementation, PG2 1104 and its driver circuit (e.g., Second Logic 1103) are contained in a single EBB as illustrated with reference to FIG. 11A.

Figure 11B:
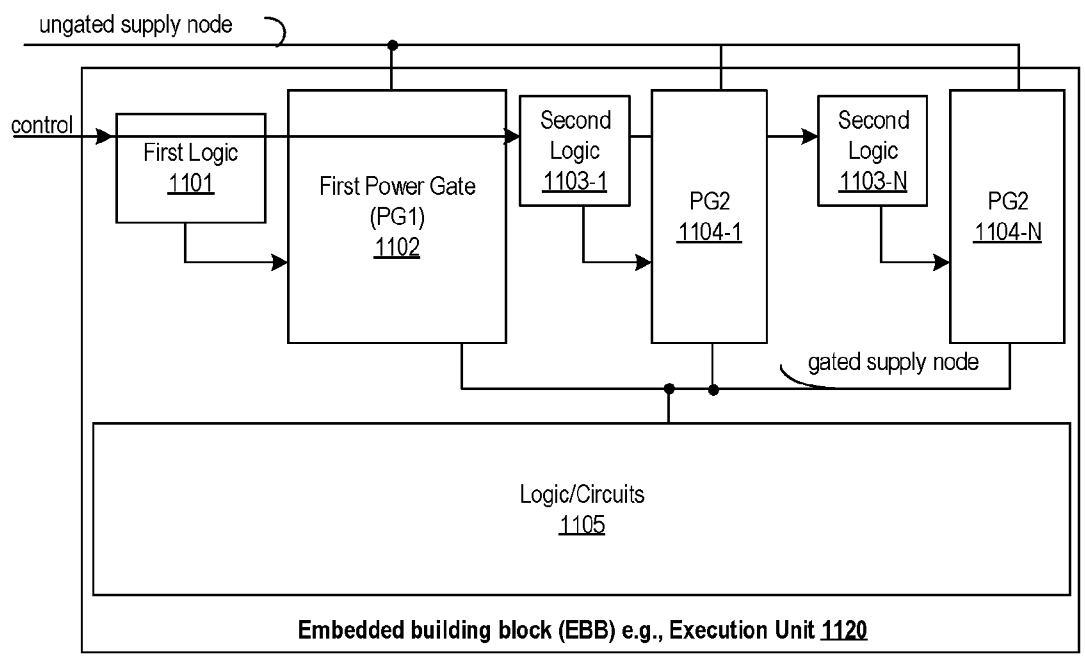
FIG. 11B illustrates an EBB with distributed apparatus for data retention and supply noise mitigation, according to some embodiments of the disclosure.

FIG. 11B illustrates EBB 1120 (e.g., execution unit 552A, or any logical block described with reference to FIGS. 1-10) with distributed apparatus for data retention and supply noise mitigation, according to some embodiments of the disclosure. It is pointed out that those elements of FIG. 11B having the same reference numbers (or names) as the elements of any other figure can operate or function in any manner similar to that described, but are not limited to such. Compared to FIG. 11A, here 'N' PG2s are distributed across the floorplan of EBB 1120, where 'N' is an integer greater than one. As such, in some embodiments, there are 'N' PG2s (e.g., PG2 1104-1 through PG2 1104-N) and associated 'N' Second Logics (e.g., 1103-1 through 1103-N). In some embodiments, each row of distributed PG2 elements shares a driver circuit for minimum area overhead.

Figure 12:
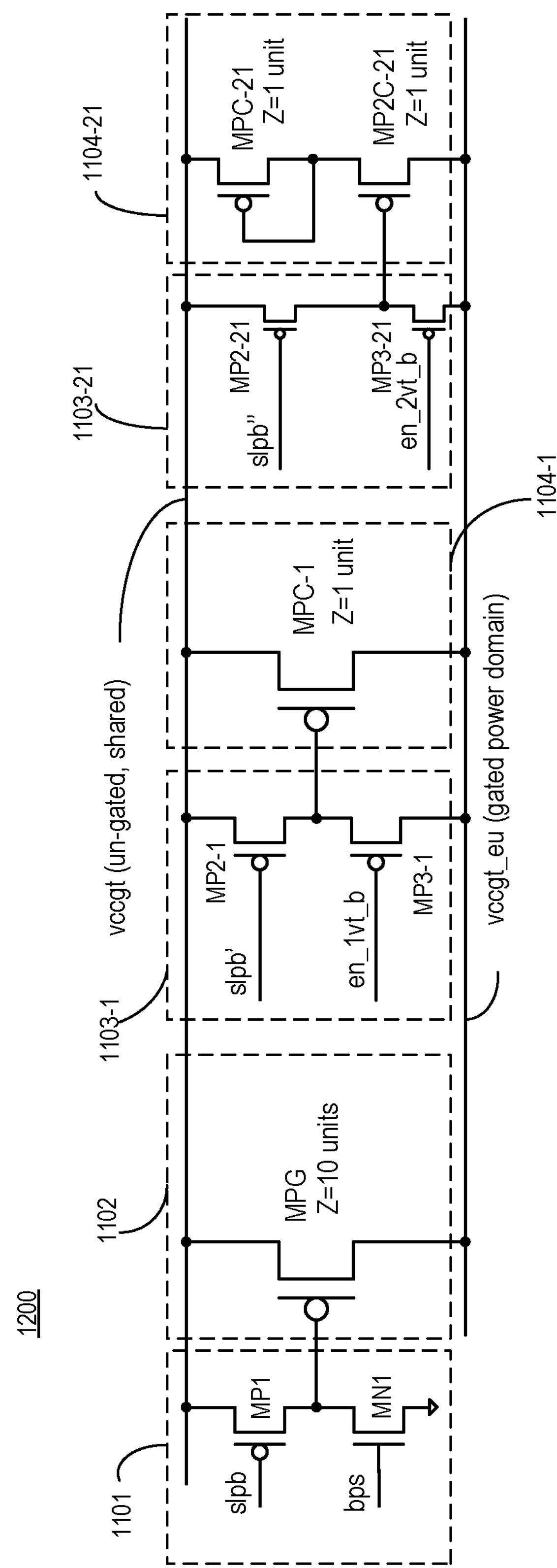
FIG. 12 illustrates an apparatus for data retention with standalone 1-Vt (one threshold) and 2-Vt (two threshold) clamps.

FIG. 12 illustrates apparatus 1200 for data retention with standalone 1-Vt and 2-Vt clamps. It is pointed out that those elements of FIG. 12 having the same reference numbers (or names) as the elements of any other figure can operate or function in any manner similar to that described, but are not limited to such.

In some embodiments, First Logic 1101 (or first driver) comprises p-type transistor MP1 coupled in series with n-type transistor MN1 such that the source terminal of transistor MP1 is coupled to the ungated or shared power supply (vccgt) node, the drain terminal of transistor MP1 is coupled to the drain terminal of transistor MN1. In some embodiments, transistor MP1 is controlled by a first sleep signal "slpb" while transistor MN1 is controlled by bypass signal "bps." In some embodiments, PG1 1102 comprises p-type transistor MPG (e.g., the main power gate) having a gate terminal coupled to the drain terminals of transistors MP1 and MN1, source terminal coupled to the ungated power supply node, and a drain terminal coupled to the gated power supply node. In some embodiments, when "slpb" is low and "bps" is low, the logic or EBB is in sleep mode, and transistor MP1 is turned on which in turn turns off the power gates MPG. In some embodiments, when sleep logic is to be bypassed, "bps" is made high (while "slpb" is made high) which causes transistor MN1 to be turned on, which in turn turns on power gate MPG, also referred to as MPG 1102.

In some embodiments, apparatus 1200 includes separate secondary power gates for providing 1-Vt clamp and 2-Vt clamp functions such that each power gate has associated control logic. In this example, p-type transistor MPC-1 1104-1 is a secondary power gate which is controllable by logic 1103-1. Logic 1103-1 may include a stack of p-type transistors MP2-1 and MP3-1 coupled between the ungated supply node and the gated supply node such that a common node of transistors MP2-1 and MP3-1 is coupled to the gate terminal of power gate MPC-1 1104-1. Here, transistor MP2-1 is controllable by a second sleep signal "slpb'" while transistor MP3-1 is controllable by an active-low 1-Vt enable signal (en_1vt_b). To configure power gate MPC-1 1104-1 as a 1-Vt clamp, transistor MP2-1 is turned off and transistor MP3-1 is turned on. As such, power gate MPC-1 becomes diode connected and drops the voltage level on the gated supply node by approximately one threshold voltage of transistor MPC-1. For full destructive sleep, slpb=slpb'=slpb"=0. For 1Vt clamp mode, slpb=slbp"=0, but slpb'=1. For 2Vt clamp mode, slpb=slpb'=0, but slpb"=1.

Continuing with the example of apparatus 1200, to provide the ability for clamping the voltage on the gated power supply node by 2-Vt, a separate power gate and associated logic is provided. Here, power gate 1104-21 is operable to provide a 2-Vt clamp, and is coupled to its associated driving logic 1103-21. Logic 1103-21 comprises a stack of p-type transistors MP2-21 and MP3-21 coupled between the ungated supply node and the gated supply node. The gate terminal of MP2-21 is controlled by a third sleep signal "slpb"" while the gate terminal of transistor MP3-21 is controllable by an active-low 2-Vt enable signal "en_2vt_b" such that a common node of transistors MP2-21 and MP3-21 is coupled to the gate terminal of power gate MP2C-21 1104-21. Power gate 1104-21 includes p-type diode connected transistor MPC-21 coupled in series with the secondary power gate transistor MP2C-21. When a 2-Vt clamp is to be enabled, "en_2vt_b" is low which causes transistor MP2C-21 to be diode connected in series with diode connected MPC-21.

In this topology, to enable the 1-Vt clamp, device MPC1 1104-1 and its driver 1103-1 need to be added. Likewise, to enable the 2-Vt clamp, additional devices MPC-21 and MP2C-21 of power gate 1104-21 and associated driver 1103-21 need to be inserted. These 1-Vt and 2-Vt clamps may entail a significant area overhead. For example, 10% of the original MPG width 'Z' is used to build the 1-Vt clamp 1104-1, and 20% of the original MPC1 width 'Z' is used to build the 2-Vt clamp 1104-21.

Figure 13:
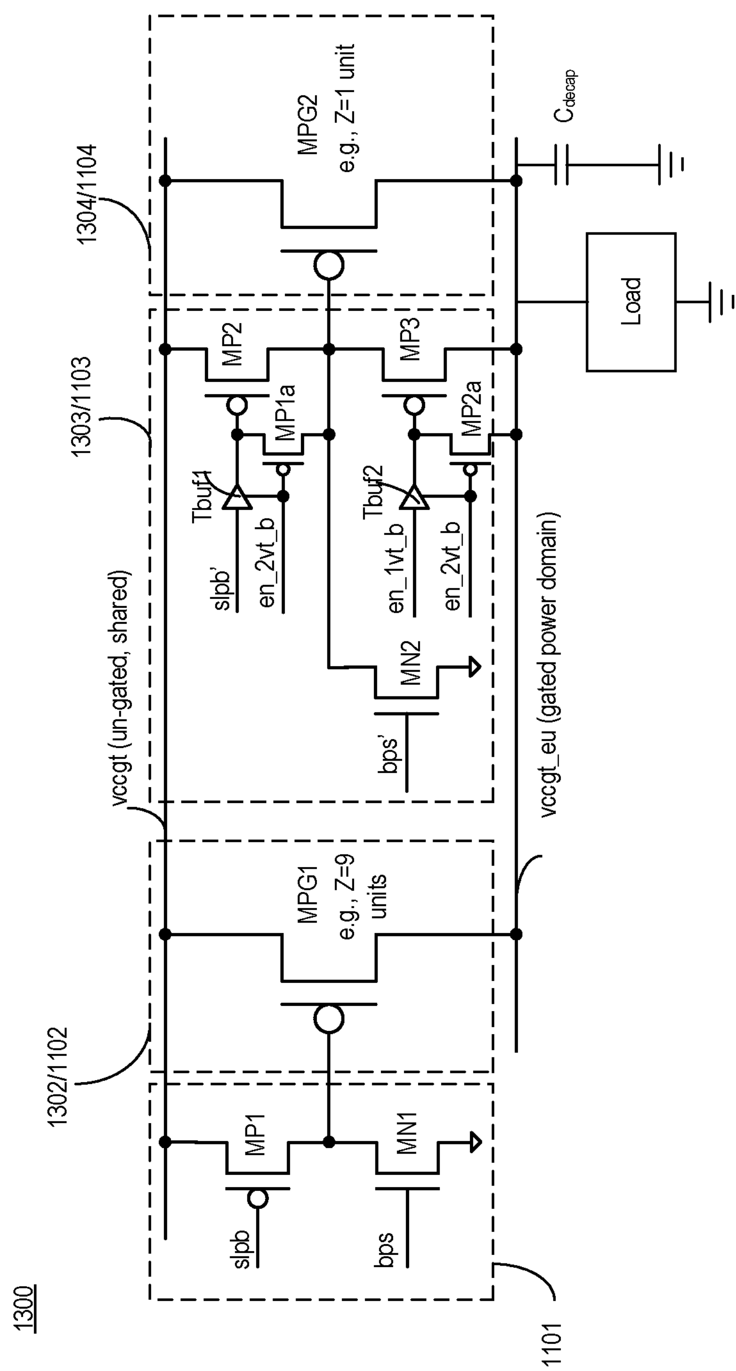
FIG. 13 illustrates an apparatus for data retention and supply noise mitigation, and with destructive sleep, active, bypass, and multi-threshold clamping operating modes, according to some embodiments of the disclosure.

FIG. 13 illustrates apparatus 1300 for data retention and supply noise mitigation, and with destructive sleep, active, bypass operation, 1-Vt clamp, and 2-Vt clamp modes, according to some embodiments of the disclosure. It is pointed out that those elements of FIG. 13 having the same reference numbers (or names) as the elements of any other figure can operate or function in any manner similar to that described, but are not limited to such. Here, load (e.g., Logic/Circuits 1105) and decoupling capacitor Cdecap is coupled to the gated power supply node.

In some embodiments, the overall area of FIG. 12 can be reduced by splitting off a portion of the power gate (e.g., the sum of widths of transistors MPG 1102, MPC-1 1104-1, and MP2C-21 1104-21) and reconfiguring the power gate to enable one or several intermediate sleep/clamp modes. For example, compared to apparatus 1200 of FIG. 12, 10% of the original MPG width 'Z' can be used to build a retention clamp which can clamp by 1-Vt or 2-Vt such that first power gate MPG1 has Z=9 units and second power gate MPG2 has Z=1 unit. In some embodiments, a portion of MPG is re-configured as retention clamps, and as such using and/or adding devices MPC-1, MP2C-21 is avoided.

In some embodiments, Second Logic 1303/1103 comprises a stack of p-type transistors MP2 and MP3, bypass n-type transistor MN2, p-type transistors MP1*a* and MP2*a*, and tri-state-able buffers Tbuf1 and Tbuf2. In some embodiments, transistor MN2 is controllable by "bps'". In some embodiments, "bps" and "bps'" re the same signals. In some embodiments, "bps" and "bps'" are independent bypass signals. For example, in some embodiments, "bps" is used to bypass MPG1 but "bps'" is set to disable transistor MN2 and so the second power gate MPG2 is not bypassed. In some embodiments, the common node of transistors MP2 and MP3 are coupled to the gate terminal of the second power gate MPG2 1104. In some embodiments, the drain terminal of transistor MN2 is coupled to the gate terminal of second power gate MPG2.

In some embodiments, the gate terminal of MP2 is controlled by the output of Tbuf1 and transistor MP1*a*. In some embodiments, Tbuf1 receives "slpb'" and drives "slpb'" to the gate of transistor MP2 when "en_2vt_b" is logical high. Here, "slpb?" and "slpb" may be same or independent signals. For example, in some embodiments, "slpb" is used to place the first power gate MPG1 in sleep mode but "slpb'" may be set to keep transistor MPG2 in active mode. In another example, separate slpb and slpb' signals allow to enable the 1-Vt clamp mode in situations where MPG1 is to be turned off (slpb=0) while MP2 needs to be turned off (slpb'=1). In some embodiments, when "en_2vt_b" is logical low, Tbuf1 is placed in high impedance state and does not drive the gate of transistor MP2.

In some embodiments, the gate terminal of MP3 is controlled by the output of Tbuf2 and transistor MP2*a*. In some embodiments, Tbuf2 receives "en_1vt_b" and drives "en_1vt_b" to the gate of transistor MP3 when "en_2vt_b" is logical high. In some embodiments, when "en_2vt_b" is logical low, Tbuf2 is placed in high impedance state and does not drive the gate of transistor MP3.

A person skilled in the art would appreciate that the total size of the power gate is typically very large (e.g., approximately 11,880 μm total width for one execution unit 552A), whereas the drivers of Second Logic 1303/1103 for the second power gate MPG2 are comparatively small (e.g., around 1% of the original PG size). As such, in some embodiments, the existing power gate MPG 1102 of FIG. 12 is re-used to enable the clamp modes at a low area overhead.

For example, a portion of an existing p-type power gate MPG 1102 of FIG. 12, which is generally used for destructive sleep, is re-configured as a diode-connected transistor MPG2 1304/1104 to enable a 1-Vt drop retention clamp mode while most of the power gate remains the primary power gate. For example, instead of 10 units of 'Z' for MPG of FIG. 12, here MPG1 1302/1102 has 9 units while one equivalent unit of MPG1 1302/1102 is reconfigured as secondary power gate MPG2 1304/1104 controllable by Second Logic 1303. A 1-Vt clamp and a 2-Vt clamp is derived by Second Logic 1303 in association with secondary power gate MPG2, in accordance with some embodiments.

When 1-Vt clamp mode is enabled (e.g., "en_1vt b"=0), the voltage across the Load (i.e., voltage on the gated power supply node) is reduced to VCC−Vtp, where "Vtp" is the threshold-voltage of the second power gate MPG2, and where VCC is the ungated power supply. The 1-Vt drop clamp mode is characterized by reduced leakage current compared to the standby mode (e.g., clock gating mode in which clocks to flip-flops and other sequential units are gated while the power gates are fully turned on). In some embodiments, to provide more energy savings, two stacked diode-connected p-devices devices MP2 and MP3 of Second Logic 1303/1103 enable a deeper sleep mode, characterized by a voltage drop of approximately VCC−2Vtp across the Load circuit.

In some embodiments, to minimize the area cost of this 2-Vt drop clamp mode, transistors MP2 and MP3 are designed to be small devices compared to the power gate MPG2 1304/1104. In some embodiments, transistors MP2 and MP3, while regulating the gated supply rail to around VCC−2Vtp, merely contribute a small portion to the total load current. The largest portion of the load leakage current is provided by MPG2, in accordance with some embodiments. In some embodiments, only MPG2 is weakly turned on (e.g., its gate voltage is VCC−Vt) and provides most of the load current. In some embodiments, MPG1 is turned off during clamp modes.

Depending on the input supply voltage VCC on the ungated power supply node, the clamp modes can be used to enable data retention in the memories and flops. For example, for a typical input voltage between 0.75V and 1.1V on the ungated power supply node, the 1-Vt clamp can ensure retention, while the 2-Vt clamp may need a higher input around 1.1V to ensure retention. For all input voltages, the 1-Vt and 2-Vt clamps can also be used for intermediate destructive sleep states, with the purpose of mitigating di/dt and VCC noise during wake-up, in accordance with some embodiments.

FIGS. 14A-D illustrate the four operating states of apparatus 1300. These four operating states are: 1) destructive sleep; 2) bypass/active; 3) 1-Vt clamp mode; and 4) 2-Vt clamp mode. It is pointed out that those elements of FIGS. 14A-D having the same reference numbers (or names) as the elements of any other figure can operate or function in any manner similar to that described, but are not limited to such.

Figure 14A:
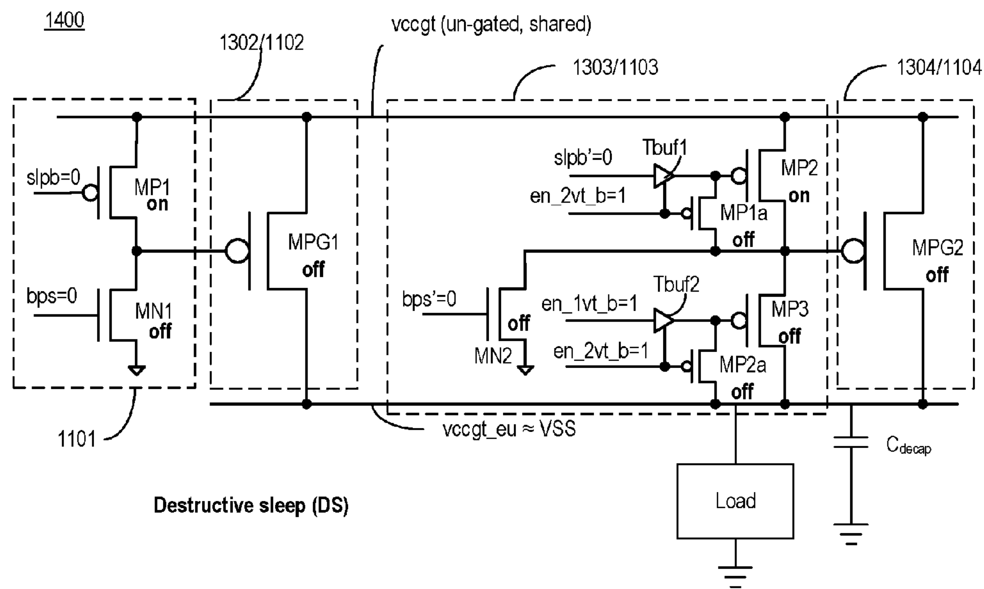
FIG. 14A illustrates an apparatus for data retention and supply noise mitigation, configured to operate in destructive sleep, according to some embodiments of the disclosure.

FIG. 14A illustrates apparatus 1400 (same as 1300) for data retention and supply noise mitigation, configured to operate in destructive sleep, according to some embodiments of the disclosure. In destructive sleep (DS) mode, "slpb" and "slpb'" are set to logical low '0', "bps" and "bps'" are set to logical low '0', "en_2vt_b" is set to logical high '1', "en_1vt_b" is set to logical '1'. As such, transistors MP1 and MP2 are on, while transistors MN1, MN2, MP3, MP1*a*, MP2*a*, MPG1, and MPG2 are off. During destructive sleep mode the ungated supply node is approximately VSS (ground) as it discharges overtime.

Figure 14B:
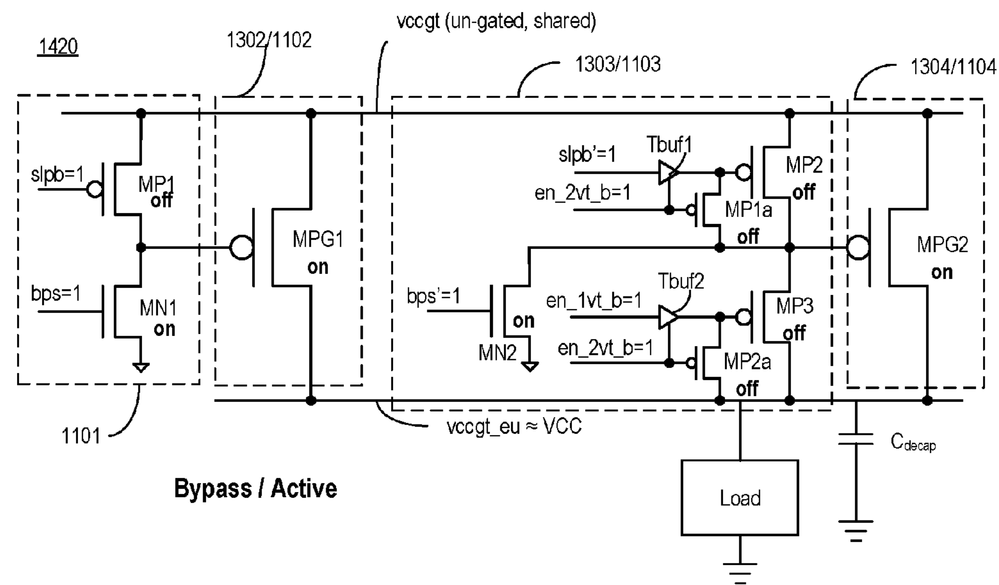
FIG. 14B illustrates an apparatus for data retention and supply noise mitigation, configured to operate in bypass/active mode, according to some embodiments of the disclosure.

FIG. 14B illustrates apparatus 1420 (same as 1300) for data retention and supply noise mitigation, configured to operate in bypass/active mode, according to some embodiments of the disclosure. In active and/or bypass modes, "slpb" and "slpb'" are set to logical high '1', "bps" and "bps'" are set to logical high '1', "en_2vt_b" is set to logical high '1', "en_1vt_b" is set to logical '1'. As such, transistor MP1 and MP2 are off, power gates MPG1 and MPG2 are on, transistors MN1 and MN2 are on, transistors MP3, MP1*a* and MP2*a* are off. During bypass/active mode, the ungated supply node is pulled up to VCC (e.g., the same power supply level as the power supply on the ungated power supply node). In some embodiments, the destructive sleep and active/bypass modes remain equivalent to a baseline design with a single power gate, since MPG1 and MPG2 are parallel connected and can both be strongly turned off and on, with local buffers.

Figure 14C:
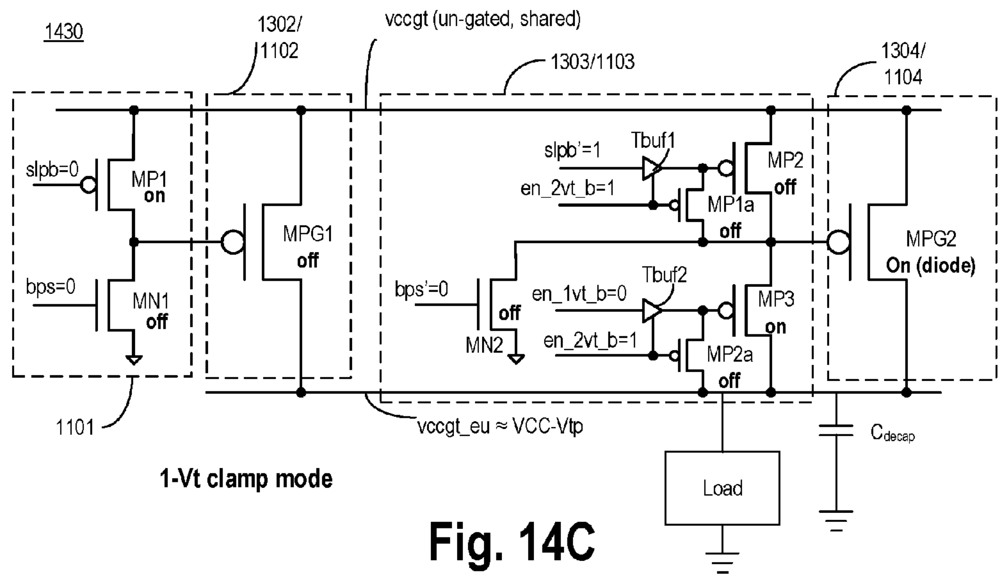
FIG. 14C illustrates an apparatus for data retention and supply noise mitigation, configured to operate in 1-Vt clamp mode, according to some embodiments of the disclosure.

FIG. 14C illustrates apparatus 1430 (same as 1300) for data retention and supply noise mitigation, configured to operate in 1-Vt clamp mode, according to some embodiments of the disclosure. In the 1-Vt clamp mode, "slpb" and "bps" are set to logical low '0', "slpb'" is set to logical high '1', "bps'" is set to logical low '0', "en_2vt_b" is set to logical high '1', and "en_1vt_b" is set to logical '0'. As such, transistors MN1, MPG1, MP2, MP1*a*, and MP2*a* are off, transistors MP1 and MP3 are on, and transistor MPG2 is turned on (diode-connected). In the 1-Vt clamp mode, the second power gate MPG2 is configured as a diode-connected transistor, by turning on device MP3. In this case, the voltage on the gated supply node settles at a voltage equal to VCC−Vtp.

Figure 14D:
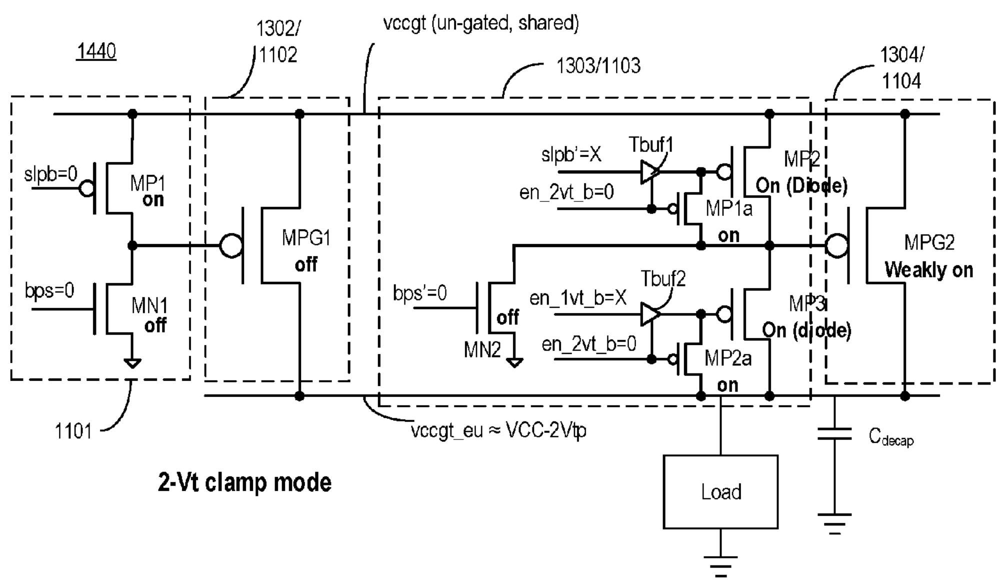
FIG. 14D illustrates an apparatus for data retention and supply noise mitigation, configured to operate in 2-Vt clamp mode, according to some embodiments of the disclosure.

FIG. 14D illustrates apparatus 1440 (same as 1300) for data retention and supply noise mitigation, configured to operate in 2-Vt clamp mode, according to some embodiments of the disclosure. In the 2-Vt clamp mode, "slpb" and "bps" are set to logical low '0', "bps'" is set to logical low '0', "slpb'" is don't care 'X' (i.e., it can be set to logical '1' or '0'), "en_2vt_b" is set to logical high '0', and "en_1vt_b"

is don't care 'X' (i.e., it can be set to logical '0' or '1'). As such, transistors MN1, MN2, MPG1, are off, transistors MP1, MP1*a*, and MP2*a* are on, transistors MP2 and MP3 are on (diode-connected), and transistor MPG2 is turned on weakly.

During the 2Vt clamp mode, both devices MP2 and MP3 are configured as diode-connected transistors, which regulates the gated supply node to a voltage of around VCC−2Vt, where "VCC" is the voltage on the ungated node. Since transistors MP2 and MP3 are small devices, they provide a small portion of the total load current to the Load. In order to achieve a 2-Vt clamp operation, the second power gate MPG2 is turned on weakly by driving its gate to VCC−Vtp, by taking advantage of the Vtp drop across MP2. As such, the second power gate MPG2 supplies the majority of the current to the Load, while MP2 and MP3 supply a small portion of the load current and are used to hold the gated supply node at a constant voltage. Due to the weakly turned on second power gate MPG2 between the un-gated and gated supply nodes, the voltage drop from the un-gated to the gated supply node is slightly lower than 2Vtp. The term "weakly on" in this disclosure generally refers to turning on a transistor by biasing its gate terminal just at around its threshold voltage so as to barely turn on the device as opposed to biasing its gate terminal to ground (when the transistor is a p-type transistor) or biasing its gate terminal to VCC (when the transistor is an n-type transistor).

Figure 15:
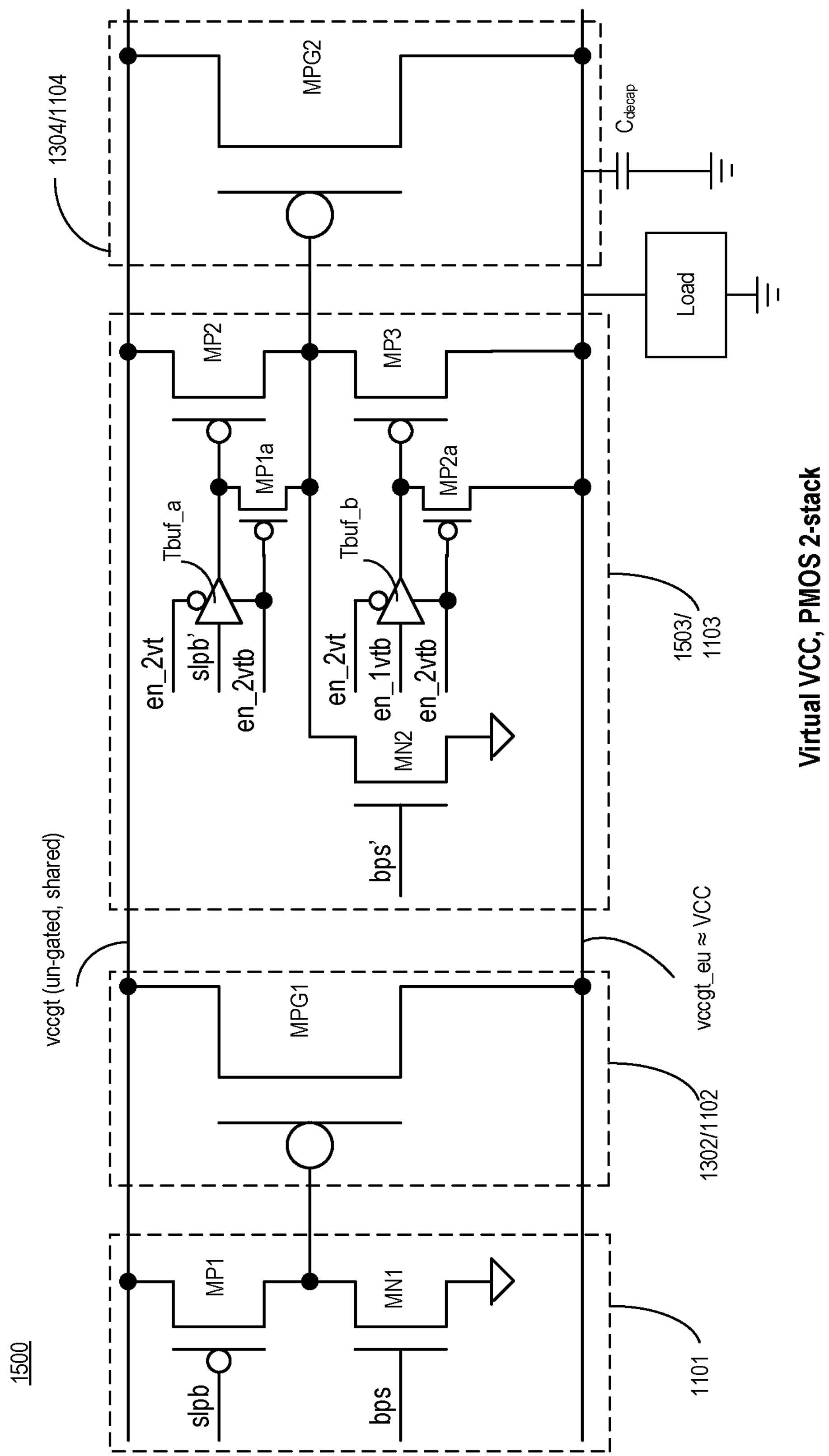
FIG. 15 illustrates an apparatus for data retention and supply noise mitigation using a two-stack p-type driver for the secondary power gate, and with destructive sleep, active/bypass operating modes, and multi-threshold clamping, according to some embodiments of the disclosure.

FIG. 15 illustrates apparatus 1500 for data retention and supply noise mitigation using a two-stack p-type driver for the secondary power gate, and with destructive sleep, active/bypass, 1-Vt clamp, and 2-Vt clamp operation modes, according to some embodiments of the disclosure. Apparatus 1500 is similar to apparatus 1300. In some embodiments, any additional enable signal needed to turn on/off the tristate-able buffers in apparatus 1300 is done internal to the tristate-able buffers. In some embodiments, the buffer or drivers Tbuf_a and Tbuf_b in second logic 1503/1103 are tristate-able buffers. For example, Tbuf_a and Tbuf_b are enabled or disabled by "en_2vt" and "en_2vtb" (which is the inverse of "en_2vt"). Here, labels for node names and signal names are interchangeably used. For example, "en_2vt" may refer to node "en_2vt" or signal "en_2vt" depending on the context of the sentence.

Figure 16:
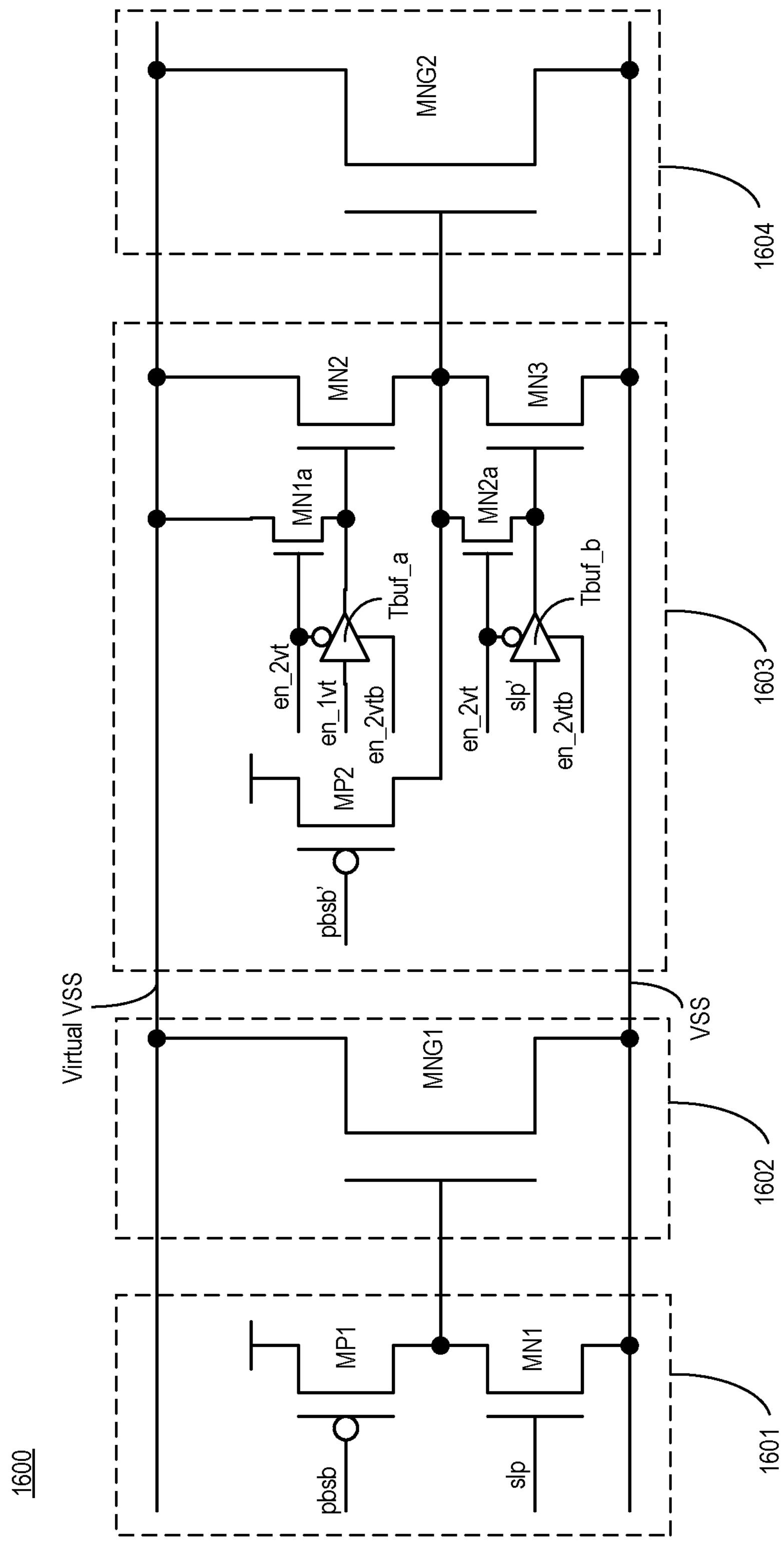
FIG. 16 illustrates an apparatus for data retention and supply noise mitigation using a two-stack n-type driver for the secondary power gate, and with destructive sleep, active/bypass operating modes, and multi-threshold clamping, according to some embodiments of the disclosure.

FIG. 16 illustrates apparatus 1600 for data retention and supply noise mitigation using a two-stack n-type driver for the secondary power gate, and with destructive sleep, active/bypass, 1-Vt clamp, and 2-Vt clamp operating modes, according to some embodiments of the disclosure. Apparatus 1600 can be part of any EBB (e.g., execution unit 552A, or any logical block described with reference to FIGS. 1-10).

The embodiment of FIG. 13 illustrates a power gating architecture for a power supply, while the embodiment of FIG. 16 illustrates a ground gating architecture for a ground supply. In some embodiments, First Logic 1601 (or first driver) comprises p-type transistor MP1 coupled in series with n-type transistor MN1 such that the source terminal of transistor MP1 is coupled to ungated or shared power supply (vccgt), and the drain terminal of transistor MP1 is coupled to the drain terminal of transistor MN1. In some embodiments, transistor MN1 is controlled by sleep signal "slp" while transistor MP1 is controlled by bypass signal "pbsb." In some embodiments, the first ground gate comprises n-type transistor MNG1 1602 (e.g., the main ground gate) having a gate terminal coupled to the drain terminals of transistors MP1 and MN1, source terminal coupled to the ungated ground supply node, and a drain terminal coupled to the gated ground supply node (e.g., Virtual VSS).

In some embodiments, Second Logic 1603 comprises a stack of n-type transistors MN2 and MN3, bypass p-type transistor MP2, n-type transistors MN1*a* and MN2*a*, and tristate-able buffers Tbuf_a and Tbuf_b. In some embodiments, transistor MP2 is controllable by "pbsb'". In some embodiments, "pbsb" and "pbsb'" are the same signals. In some embodiments, "pbsb" and "pbsb'" are independent bypass signals. For example, in some embodiments, "pbsb" is used to bypass first ground gate MNG1 but "pbsb'" is set to disable transistor MP2 and so the second ground gate MNG2 is not bypassed. In some embodiments, the common node of transistors MN2 and MN3 are coupled to the gate terminal of second ground gate MNG2 1604. In some embodiments, the drain terminal of transistor MP2 is coupled to the gate terminal of ground gate MNG2.

In some embodiments, the gate terminal of MN2 is controlled by the output of Tbuf_a and transistor MN1*a*. In some embodiments, Tbuf_a receives "en_1vt" (enable 1-Vt mode) signal and drives the "en_1vt" signal to the gate of transistor MN2 when "en_2vt" is logical low and "en_2vtb" is logical high, where "en_2vtb" is the inverse of "en_2vt". In some embodiments, "en_2vt" also controls the gate terminal of transistor MN1*a*.

In some embodiments, Tbuf_b receives sleep signal "slp'" and drives "slp'" to the gate of transistor MN3 when "en_2vtb" is logical high and "en_2vt" is logical low. Here, "slp'" and "slp" may be same or independent signals. For example, in some embodiments, different "slp" and "slp'" signals are used to be able to turn MNG1 off while using MNG2 for clamp modes. In some embodiments, when "en_2vtb" is logical low and "en_2vt" is logical high, Tbuf_b is placed in high impedance state and does not drive the gate of transistor MN3. However, "en_2vt" drives MN2*a* which is turned on to couple the gate of MN3 to the drain terminal of MN3 and to the gate terminal of the second ground gate MNG2.

In some embodiments, to enable destructive sleep mode, "slp" and "slp'" are set to logical high, "pbsb" and "pbsb'" are set to logical high, "en_2vt" is set to logical low, "en_2vtb" is set to logical high, and "en_1vt" is set to logical low. In some embodiments, to enable bypass/active mode, "pbsb" and "pbsb'" are set to logical low, "slp" and "slp'" are set to logical low, "en_2vt" is set to logical low, "en_2vtb" is set to logical high, and "en_1vt" is set to logical low.

In some embodiments, to enable 1-Vt mode, "pbsb" and "pbsb'" are set to logical high, "slp" is set to logical high, "slp'" is set to logical low, "en_2vt" is set to logical low, "en_2vtb" is set to logical high, and "en_1vt" is set to logical high. In some embodiments, to enable 2-Vt mode, "pbsb" and "pbsb'" are set to logical high, "slp" is set to logical high, "slp'" is Don't care (e.g., can be either logical low or high), "en_1vt" is Don't care (e.g., can be either logical low or high), "en_2vt" is set to logical high, and "en_2vtb" is set to logical low. Compared to apparatus 1300 of FIG. 13, instead of dropping the voltage level (or clamping) the voltage level of the gated power supply, here the Virtual VSS is raised by 1-Vt or 2-Vt relative to ground to realize 1-Vt clamp or a 2-Vt clamp, respectively.

Figure 17:
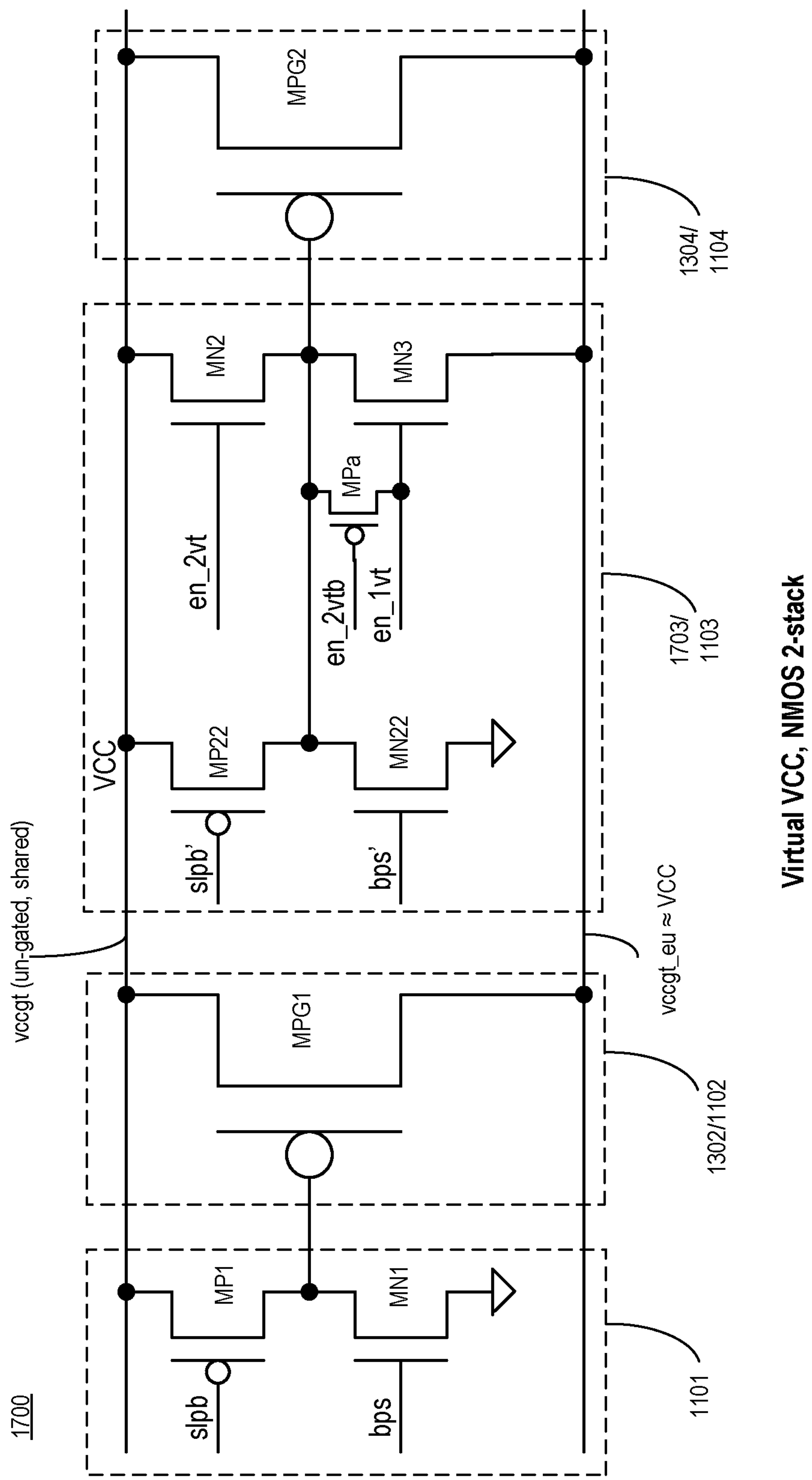
FIG. 17 illustrates an apparatus for data retention and supply noise mitigation using a two-stack n-type driver for the secondary power gate, and with destructive sleep, active/bypass operating modes, and multi-threshold clamping, according to some embodiments of the disclosure.

FIG. 17 illustrates apparatus 1700 for data retention and supply noise mitigation using a two-stack n-type driver for the secondary power gate, and with destructive sleep, active/bypass, 1-Vt clamp, and 2-Vt clamp operating modes, according to some embodiments of the disclosure. It is pointed out that those elements of FIG. 17 having the same reference numbers (or names) as the elements of any other figure can operate or function in any manner similar to that described, but are not limited to such. Compared to Second Logic 1303 of FIG. 13, here an n-type stack is used instead of a p-type stack.

In some embodiments, Second Logic 1703/1103 comprises n-type stack formed of transistors MN2 and MN3 coupled together in series and between ungated power supply node (VCC) and gated power supply node. In some embodiments, the common node coupling transistors MN2 and MN3 is coupled to the gate of the second power gate MPG2 1304/1104. In some embodiments, the gate terminal of MN2 is controlled by "en_2vt". In some embodiments, the gate terminal of MN3 is controlled by "en_1vt" and p-type transistor MPa. In some embodiments, transistor MPa is controlled by "en_2vtb", where the source/drain terminals of transistor MPa are coupled to the gate of second power gate MPG2 and the gate of MN3.

In some embodiments, Second Logic 1703/1103 comprises p-type transistor MP22 coupled in series with n-type transistor MN22, such that a common node coupling transistor MP22 and transistor MN22 is coupled to the gate terminal of the second power gate MPG2 1304/1104. In some embodiments, the source terminal of MP22 is coupled to the ungated supply node, the drain terminal of MP22 is coupled to the drain terminal of MN22, and the gate terminal of MP22 is coupled to sleep signal "slpb'". In some embodiments, the source terminal of MN22 is coupled to ground, the drain terminal of MN22 is coupled to the drain terminal of MP22, and the gate terminal of MN22 is coupled to sleep signal "bps'".

In some embodiments, to enable destructive sleep mode, "slpb" and "slpb'" are set to logical low, "bps" and "bps'" are set to logical low, "en_2vt" is set to logical low, "en_2vtb" is set to logical high, and "en_1vt" is set to logical low. In some embodiments, to enable bypass/active mode, "slpb" and "slpb'" are set to logical high, "bps" and "bps" are set to logical high, "en_2vt" is set to logical low, "en_2vtb" is set to logical high, and "en_1vt" is set to logical low.

In some embodiments, to enable 1-Vt mode, "bps" and "bps'" are set to logical low, "slpb'" is set to logical low, "slpb'" is set to logical high, "en_2vt" is set to logical low, "en_2vtb" is set to logical high, "en_1vt" is set to logical high. In some embodiments, to enable 2-Vt mode, "bps" and "bps'" are set to logical low, "slpb" is set to logical low, "en_1vt" is not driven (e.g., tri-stated), "en_2vt" is set to logical high, and "en_2vtb" is set to logical low.

Figure 18:
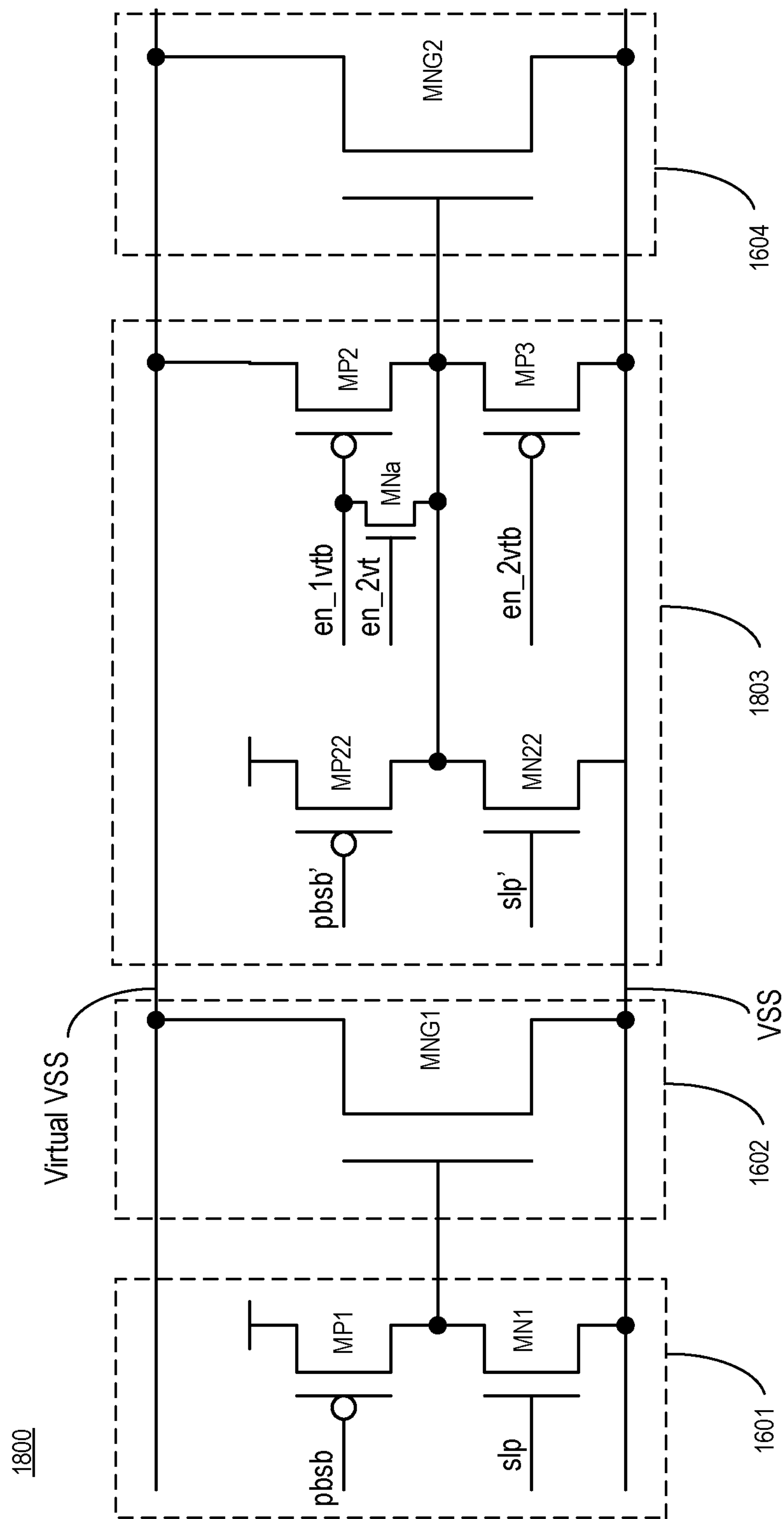
FIG. 18 illustrates an apparatus for data retention and supply noise mitigation using a two-stack p-type driver for the secondary power gate, and with destructive sleep, active/bypass operating modes, and multi-threshold clamping according to some embodiments of the disclosure.

FIG. 18 illustrates apparatus 1800 for data retention and supply noise mitigation using a two-stack p-type driver for the secondary power gate, and with destructive sleep, active/bypass, 1-Vt clamp, and 2-Vt clamp operating modes, according to some embodiments of the disclosure. Apparatus 1800 is similar to apparatus 1600 but with a different Second Logic 1803 (instead of 1603). Apparatus 1800 can be part of any EBB (e.g., execution unit 552A, or any logical block described with reference to FIGS. 1-10).

In some embodiments, Second Logic 1803 comprises p-type stack formed of transistors MP2 and MP3 coupled together in series and between gated ground supply node (Virtual Vss) and ungated ground supply node (VSS). In some embodiments, the common node coupling transistors MP2 and MP3 is coupled to the gate of the second ground gate MNG2 1604. In some embodiments, the gate terminal of MP3 is controlled by "en_2vtb". In some embodiments, the gate terminal of MP2 is controlled by "en_1vtb" and n-type transistor MNa. In some embodiments, transistor MNa is controlled by "en_2vt", where the source/drain terminals of transistor MNa are coupled to the gate of second ground gate MNG2 1604 and the gate of MP2.

In some embodiments, Second Logic 1803 comprises p-type transistor MP22 coupled in series with n-type transistor MN22, such that a common node coupling transistor MP22 and transistor MN22 is coupled to the gate terminal of the second ground gate MNG2 1604. In some embodiments, the source terminal of MP22 is coupled to the ungated supply node, the drain terminal of MP22 is coupled to the drain terminal of MN22, and the gate terminal of MP22 is coupled to sleep signal "pbsb'". In some embodiments, source terminal of MN22 is coupled to ground (VSS), the drain terminal of MN22 is coupled to the drain terminal of MP22, and the gate terminal of MN22 is coupled to sleep signal "slp'".

In some embodiments, to enable destructive sleep mode, "slp" and "slp'" are set to logical high, "pbsb" and "pbsb'" are set to logical high, "en_2vt" is set to logical low, "en_2vtb" is set to logical high, and "en_1vtb" is set to logical high. In some embodiments, to enable bypass/active mode, "slp" and "slp'" are set to logical low, "pbsb" and "pbsb'" are set to logical low, "en_2vt" is set to logical low, "en_2vtb" is set to logical high, and en_1vtb is set to logical high.

In some embodiments, to enable 1-Vt mode, "bpsb" and "bpsb'" are set to logical high, "slp" is set to logical high, "slp'" is set to logical low, "en_2vt" is set to logical low, "en_2vtb" is set to logical high, and "en_1vtb" is set to logical low. In some embodiments, to enable 2-Vt mode, "bpsb" and "bpsb'" are set to logical high, "slp" is set to logical high, "slp'" is set to logical low, "en_1vtb" is not driven (e.g., tri-stated), "en_2vt" is set to logical high, and "en_2vtb" is set to logical low.

Figure 19:
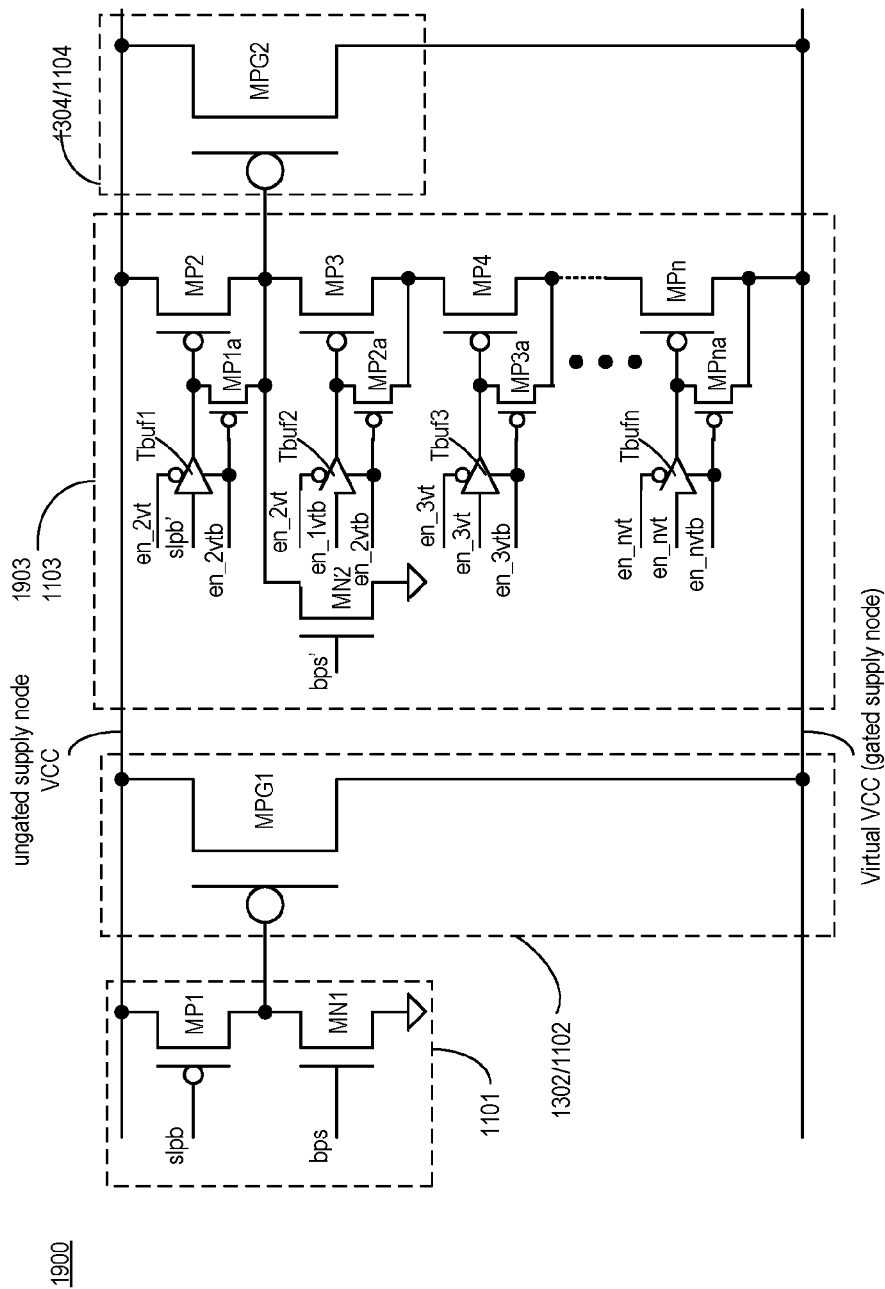
FIG. 19 illustrates an apparatus for data retention and supply noise mitigation using an n-stack of p-type drivers for the secondary power gate, and with destructive sleep, active/bypass operating modes, and multi-threshold clamping, according to some embodiments of the disclosure.

FIG. 19 illustrates apparatus 1900 for data retention and supply noise mitigation using an n-stack of p-type drivers for the secondary power gate, and with destructive sleep, active/bypass, and multi-threshold clamp operating modes, according to some embodiments of the disclosure. Compared to FIG. 15, here a stack of p-type drivers MP2, MP3, MP4, . . . MPn are used for implementing Second Logic 1903. Just as MP2 is driven by Tbuf1 and controlled by MP1*a*, in some embodiments, MP4 is driven by tristate-able buffer Tbuf3 and associated transistor MP3*a*, where Tbuf3 is controllable by "en_3vt" and "en_3vtb" and MP3*a* is controlled by "en_3vtb". In some embodiments, MPn is driven by tristate-able buffer Tbufn and associated transistor MPna, where Tbufn is controllable by "en_nvt" and "en_nvtb" and MPna is controlled by "en_nvtb".

Here, en_1vt, en_1vtb, en_2vt, and en_2vtb are controlled in the same fashion as described with reference to FIGS. 14A-D. In some embodiments, en_3vt, . . . , en_nvt are set to 0 by default, leaving transistors MP4 . . . MPn in open (i.e., in bypass). To add additional Vt drop on the gated power supply, en_3vt is asserted (i.e., =en_3vt=1), in accordance with some embodiments. To add further Vt drop, en_4vt is asserted, and so on, for example.

Figure 20:
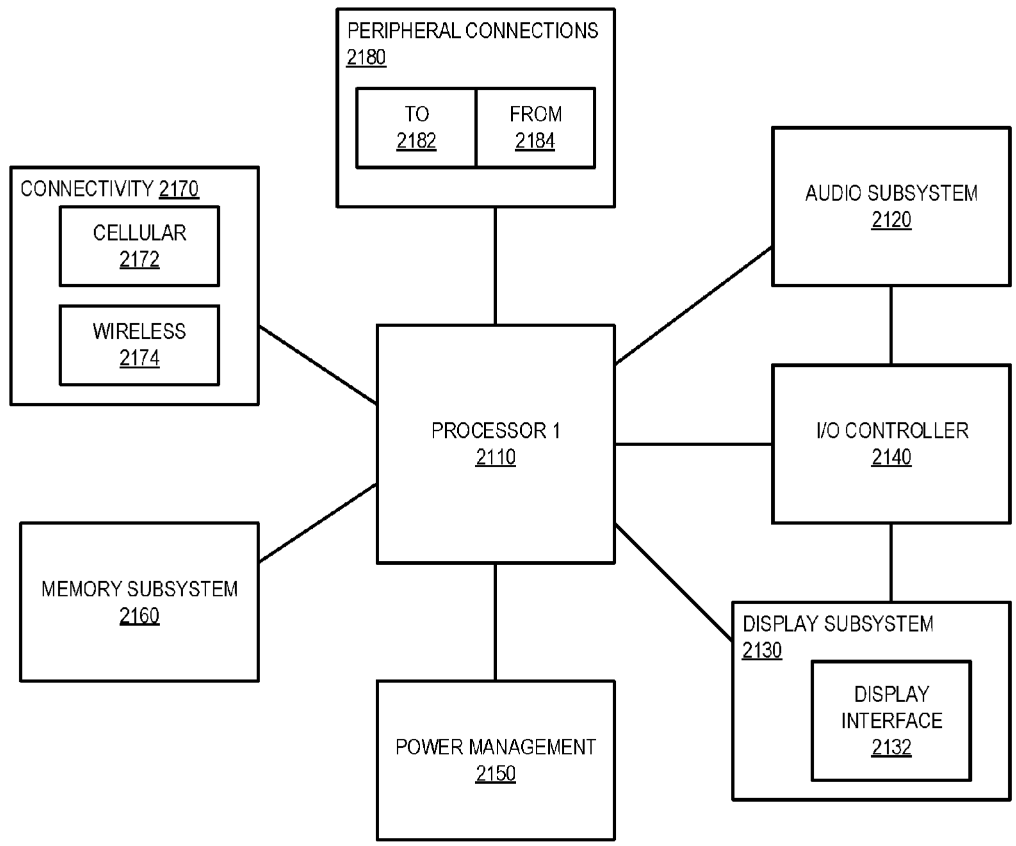
FIG. 20 illustrates a smart device or a computer system or a SoC (System-on-Chip) having an apparatus for data retention and supply noise mitigation, in accordance with some embodiments.

FIG. 20 illustrates a smart device or a computer system or a SoC (System-on-Chip) 2100 apparatus for data retention and supply noise mitigation, in accordance with some embodiments. It is pointed out that those elements of FIG. 20 having the same reference numbers (or names) as the elements of any other figure can operate or function in any manner similar to that described, but are not limited to such.

FIG. 20 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having an apparatus for data retention and supply noise mitigation, according to some embodiments discussed. Other blocks of the computing device 2100 may also include an apparatus for data retention and supply noise mitigation of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first power gate transistor coupled to an ungated power supply node and a gated power supply node, the first power gate transistor having a gate terminal controllable by a first logic; and a second power gate coupled to the ungated power supply node and the gated power supply node, the second power gate transistor having a gate terminal controllable by a second logic, wherein the first power gate transistor is larger than the second power gate transistor, and wherein the second logic has multiple modes including: weakly turn on the second power gate, diode-connect the second power gate, substantially turn on the second power gate, and turn off the second power gate.

In some embodiments, the second logic comprises transistors which are collectively smaller in size than the size of the second power gate. In some embodiments, the second logic is operable to weakly turn on the second power gate such that at least two diodes are formed between the ungated power supply node and the gated power supply node. In some embodiments, the second logic is operable to substantially turn on the second power gate during a normal active mode, and wherein the second logic is operable to fully turn off the second power gate during a destructive sleep mode.

In some embodiments, the second logic is operable to cause the second power gate to electrically form a diode between the ungated power supply node and the gated power supply node. In some embodiments, the second logic comprises a first p-type transistor coupled to the gate terminal of the second power gate and the ungated power supply node. In some embodiments, the second logic comprises a second p-type transistor coupled in series with the first p-type transistor, and coupled to the gate terminal of the second power gate and the gated power supply node. In some embodiments, the second logic comprises a third p-type-transistor coupled to a gate terminal of the first p-type transistor and the gate terminal of the second power gate.

In some embodiments, the second logic comprises a fourth p-type transistor coupled to a gate terminal of the second p-type transistor and the gated power supply node. In some embodiments, the second logic comprises a first n-type transistor coupled to the gate terminal of the second power gate and a ground node. In some embodiments, the first logic comprises: a first p-type transistor coupled to the ungated power supply node and the gate terminal of the first power gate; and a first n-type transistor coupled in series with the first p-type transistor, the first n-type transistor coupled to the gate terminal of the first power gate and a ground node.

In another example, an apparatus is provided which comprises: a first power gate transistor coupled to an ungated power supply node and a gated power supply node, the first power gate transistor having a gate terminal controllable by a first logic; and a second power gate coupled to the ungated power supply node and the gated power supply node, the second power gate transistor having a gate terminal controllable by a second logic, wherein the first power gate transistor is larger than the second power gate transistor, and wherein the second logic includes: a first p-type transistor coupled to the gate terminal of the second power gate and the ungated power supply node; a second p-type transistor coupled in series with the first p-type transistor, and coupled to the gate terminal of the second power gate and the gated power supply node; a third p-type-transistor coupled to a gate terminal of the first p-type transistor and the gate terminal of the second power gate; and a fourth p-type transistor coupled to a gate terminal of the second p-type transistor and the gated power supply node.

In some embodiments, the first, second, third, and fourth transistors are collectively smaller in size than the size of the second power gate. In some embodiments, the second logic is operable to weakly turn on the second power gate such that at least two diodes are formed between the ungated power supply node and the gated power supply node. In some embodiments, the second logic is operable to substantially turn on the second power gate during a normal active mode, and wherein the second logic is operable to fully turn off the second power gate during a destructive sleep mode. In some embodiments, the second logic is operable to cause the second power gate to electrically form a diode between the ungated power supply node and the gated power supply node. In some embodiments, the first logic comprises: a first p-type transistor coupled to the ungated power supply node and the gate terminal of the first power gate; and a first n-type transistor coupled in series with the first p-type transistor, the first n-type transistor coupled to the gate terminal of the first power gate and a ground node.

In another example, a system is provided which comprises: a memory; a processor coupled to the memory, the processor including: a first logic block; a second logic block; an ungated power supply node extending along the first and second logic blocks; a first power gate transistor coupled to the ungated power supply node common to the first and second logic blocks and a gated power supply node, the first power gate transistor having a gate terminal controllable by a first logic; and a second power gate coupled to the ungated power supply node and the gated power supply node, the second power gate transistor having a gate terminal controllable by a second logic, wherein the first power gate transistor is larger than the second power gate transistor, and wherein the second logic is operable to: weakly turn on the second power gate, substantially turn on the second power gate, turn off the second power gate, and configuring the second power gate as a diode; a wireless interface for allowing the processor to communicate with another device. In some embodiments, the processor is a graphics processor, and wherein the at least one of the first and second logic blocks is an execution unit. In some embodiments, the processor includes a voltage regulator to provide power supply to the ungated power supply node.

In another example, a method is provided which comprises: during a low power mode, turning off a first power gate coupled to an ungated power supply node and a gated power supply node; weakly turning on a second power gate coupled to the ungated power supply node and the gated power supply node; and configuring the second power gate as a diode; or turning on first and second transistors coupled to the second power gate such that at least two diodes are formed by the first and second transistors. In some embodiments, during a destructive sleep mode, the method comprises turning off the first power gate, the second power gate, and the first and second transistors. In some embodiments, during an active mode, the method comprises turning on the first and second power gates, and turning off the first and second transistors. In some embodiments, during another low power mode, the method further comprises turning on at least one of the first and second transistors such that at least one diode is formed by one of the first and second transistors and by the second power gate.

In another example, an apparatus is provided which comprises: means for turning off, during a low power mode, a first power gate coupled to an ungated power supply node and a gated power supply node; means for weakly turning on a second power gate coupled to the ungated power supply node and the gated power supply node; and means for configuring the second power gate as a diode; or means for turning on first and second transistors coupled to the second power gate such that at least two diodes are formed by the first and second transistors.

In some embodiments, the apparatus comprises means for turning off, during a destructive sleep mode, the first power gate, the second power gate, and the first and second transistors. In some embodiments, the apparatus comprises means for turning on, during an active mode, the first and second power gates, and turning off the first and second transistors. In some embodiments, the apparatus comprises means for turning on, during another low power mode, at least one of the first and second transistors such that at least one diode is formed by one of the first and second transistors and by the second power gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

a first power gate transistor coupled to an ungated power supply node and a gated power supply node; and a second power gate transistor coupled to the ungated power supply node and the gated power supply node, wherein the second power gate transistor is to be turned on such that when the second power gate transistor is turned on, it becomes diode-connected between the gated and ungated power supply nodes, wherein when the second power gate transistor is turned off, it is not diode-connected, and wherein the first power gate transistor is larger than the second power gate transistor.

2. The apparatus of claim 1, wherein the second power gate transistor is operable by a circuitry, which comprises transistors that are collectively smaller than a size of the second power gate.

3. The apparatus of claim 2, wherein the circuitry comprises a first p-type transistor coupled to a gate terminal of the second power gate transistor and the ungated power supply node.

4. The apparatus of claim 3, wherein the circuitry comprises a second p-type transistor coupled in series with the first p-type transistor, and coupled to the gate terminal of the second power gate transistor and the gated power supply node.

5. The apparatus of claim 4, wherein the circuitry comprises a third p-type-transistor coupled to a gate terminal of the first p-type transistor and the gate terminal of the second power gate transistor.

6. The apparatus of claim 2, wherein the circuitry is to operate in one or several modes including:

a first mode to weakly turn on the second power gate transistor, a second mode to substantially turn on the second power gate transistor, and a third mode to turn off the second power gate transistor.

7. An apparatus comprising:

a first power gate transistor coupled to a gated power supply node and an ungated power supply node;

a first circuitry coupled to a gate terminal of the first power gate transistor, the first circuitry comprising a first transistor of a first conductivity type and a second transistor of a second conductivity type coupled in series with the first transistor, wherein gate terminals of the first and second transistors of the first circuitry are controllable by separate nodes;

a second power gate transistor coupled to the gated and ungated power supply nodes; and a second circuitry coupled to the second power gate transistor, wherein the second circuitry is to weakly turn on the second power gate transistor.

8. The apparatus of claim 7, wherein the second circuitry comprises devices which are collectively smaller in size than a size of the second power gate transistor.

9. The apparatus of claim 7, wherein the second circuitry is to substantially turn on the second power gate transistor during a first mode, and to substantially turn off the second power gate transistor during a second mode.

10. An apparatus comprising:

an ungated power supply node;

a gated power supply node;

a power gate transistor coupled to the ungated power supply node and the gated power supply node, wherein the power gate transistor is operable to be turned on such that when the power gate transistor is turned on it is diode-connected between the gated and ungated power supply nodes, and wherein when the power gate transistor is turned off, it is not diode-connected; and a circuitry which is operable to diode-connect a device coupled to a gate of the power gate transistor.

11. The apparatus of claim 10, wherein the power gate transistor is a first power gate transistor, wherein the apparatus comprises a second power gate transistor coupled to the ungated power supply node and the gated power supply node, and wherein the second power gate is larger in size than the power gate transistor.

12. The apparatus of claim 11, wherein the second power gate transistor is controllable by a circuitry comprising a first transistor of first conductivity type and a second conductor of a second conductivity type coupled in series with the first transistor, and wherein gate terminals of the first and second transistors of the circuitry are controllable by separate nodes.

13. The apparatus of claim 10 comprises a circuitry to control the power gate transistor to cause the power gate transistor to weakly turn on.

14. The apparatus of claim 10, wherein the power gate transistor is controllable by a circuitry, which has a total size smaller than a size of the power gate transistor.

15. The apparatus of claim 10, comprises a circuitry which is operable to weakly turn on the power gate transistor such that at least two diodes are formed between the ungated power supply node and the gated power supply node.

16. The apparatus of claim 10, comprises a circuitry which is operable to substantially turn on the power gate transistor during a first mode, and wherein the circuitry is operable to fully turn off the power gate transistor during a second mode different from the first mode.

17. The apparatus of claim 16, wherein the first mode is a normal active mode.

18. The apparatus of claim 16, wherein the second mode is a destructive sleep mode.

19. An apparatus comprising:

a first power gate transistor coupled to an ungated power supply node and a gated power supply node;

a second power gate transistor coupled to the ungated power supply node and the gated power supply node;

a first transistor coupled to a gate of the second power gate transistor and the gated power supply node, such that when the transistor is turned on, the second power gate transistor is diode-connected; and a second transistor coupled to the gate of the second power gate transistor and the un-gated power supply node, wherein the first and second transistors are coupled in series.

20. The apparatus of claim 19 comprises:

a capacitor coupled to the gated power supply node; and a load coupled to the gated power supply node.

21. The apparatus of claim 19 comprises:

a third transistor coupled to a gate of the first transistor and the gated power supply node; and a fourth transistor coupled to a gate of the second transistor and the gate of the second power gate transistor.

22. The apparatus of claim 19 comprises a fifth transistor coupled to the gate of the second transistor and coupled to ground.

* * * * *